United States Patent
Kato et al.

(10) Patent No.: US 8,686,486 B2
(45) Date of Patent: Apr. 1, 2014

(54) MEMORY DEVICE

(75) Inventors: Kiyoshi Kato, Atsugi (JP); Toshihiko Saito, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/425,674

(22) Filed: Mar. 21, 2012

(65) Prior Publication Data

US 2012/0248434 A1    Oct. 4, 2012

(30) Foreign Application Priority Data

Mar. 31, 2011 (JP) ................................. 2011-078937
May 14, 2011 (JP) ................................. 2011-108885

(51) Int. Cl.
| | |
|---|---|
| H01L 27/108 | (2006.01) |
| H01L 29/94 | (2006.01) |
| H01L 29/10 | (2006.01) |
| H01L 29/12 | (2006.01) |
| H01L 23/48 | (2006.01) |
| H01L 23/52 | (2006.01) |
| H01L 29/40 | (2006.01) |

(52) U.S. Cl.
USPC ...... 257/308; 257/43; 257/758; 257/E27.086; 257/E21.646; 257/E23.151; 257/E23.164

(58) Field of Classification Search
None
See application file for complete search history.

(56) References Cited

U.S. PATENT DOCUMENTS

| | | |
|---|---|---|
| 4,735,821 A | 4/1988 | Yamazaki et al. |
| 4,861,622 A | 8/1989 | Yamazaki et al. |
| 5,084,130 A | 1/1992 | Yamazaki et al. |
| 5,302,843 A | 4/1994 | Yamazaki |
| 5,403,763 A | 4/1995 | Yamazaki |
| 5,414,288 A | 5/1995 | Fitch et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Kim, "Technology for sub-50nm DRAM and NAND Flash Manufacturing," IEDM 05: Technical Digest of International Electron Devices Meeting, pp. 333-336, Dec. 5, 2005.

(Continued)

Primary Examiner — Hoang-Quan Ho
(74) Attorney, Agent, or Firm — Eric J. Robinson; Robinson Intellectual Property Law Office, P.C.

(57) ABSTRACT

It is an object to provide a memory device where an area occupied by a memory cell is small, and moreover, a memory device where an area occupied by a memory cell is small and a data holding period is long. A memory device includes a bit line, a capacitor, a first insulating layer provided over the bit line and including a groove portion, a semiconductor layer, a second insulating layer in contact with the semiconductor layer, and a word line in contact with the second insulating layer. Part of the semiconductor layer is electrically connected to the bit line in a bottom portion of the groove portion, and another part of the semiconductor layer is electrically connected to one electrode of the capacitor in a top surface of the first insulating layer.

29 Claims, 18 Drawing Sheets

(56) References Cited

U.S. PATENT DOCUMENTS

| | | | |
|---|---|---|---|
| 5,414,289 A | 5/1995 | Fitch et al. | |
| 5,462,767 A | 10/1995 | Yamazaki et al. | |
| 5,731,856 A | 3/1998 | Kim et al. | |
| 5,744,864 A | 4/1998 | Cillessen et al. | |
| 6,018,176 A | 1/2000 | Lim | |
| 6,294,274 B1 | 9/2001 | Kawazoe et al. | |
| 6,365,452 B1 | 4/2002 | Perng et al. | |
| 6,459,112 B1* | 10/2002 | Tsuboi et al. | 257/296 |
| 6,563,174 B2 | 5/2003 | Kawasaki et al. | |
| 6,566,702 B1* | 5/2003 | Clampitt | 257/308 |
| 6,580,175 B1* | 6/2003 | Lee | 257/786 |
| 6,621,110 B1* | 9/2003 | Matsuoka et al. | 257/296 |
| 6,630,705 B2* | 10/2003 | Maeda et al. | 257/306 |
| 6,700,152 B2* | 3/2004 | Fukuda et al. | 257/306 |
| 6,727,522 B1 | 4/2004 | Kawasaki et al. | |
| 6,734,484 B2 | 5/2004 | Wu | |
| 6,809,364 B2* | 10/2004 | Matsuoka et al. | 257/296 |
| 6,815,754 B2* | 11/2004 | Clampitt | 257/308 |
| 6,878,990 B2 | 4/2005 | Yoo | |
| 7,042,040 B2 | 5/2006 | Horiguchi | |
| 7,049,190 B2 | 5/2006 | Takeda et al. | |
| 7,056,786 B2* | 6/2006 | Yun et al. | 438/253 |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,382,014 B2* | 6/2008 | Iijima | 257/310 |
| 7,385,224 B2 | 6/2008 | Ishii et al. | |
| 7,388,243 B2* | 6/2008 | Yun et al. | 257/298 |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,745,868 B2* | 6/2010 | Ohuchi | 257/307 |
| 7,781,285 B2 | 8/2010 | Kim et al. | |
| 7,936,004 B2 | 5/2011 | Kito et al. | |
| 2001/0025973 A1* | 10/2001 | Yamada et al. | 257/296 |
| 2001/0046027 A1 | 11/2001 | Tai et al. | |
| 2002/0030214 A1* | 3/2002 | Horiguchi | 257/301 |
| 2002/0056838 A1 | 5/2002 | Ogawa | |
| 2002/0132454 A1 | 9/2002 | Ohtsu et al. | |
| 2002/0173096 A1* | 11/2002 | Okudaira | 438/253 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0135190 A1* | 7/2004 | Lindstedt et al. | 257/314 |
| 2005/0017302 A1 | 1/2005 | Hoffman | |
| 2005/0040452 A1* | 2/2005 | Nakamura et al. | 257/307 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0186453 A1* | 8/2006 | Park | 257/308 |
| 2006/0197092 A1 | 9/2006 | Hoffman et al. | |
| 2006/0205147 A1* | 9/2006 | Yun et al. | 438/253 |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0255384 A1* | 11/2006 | Baars et al. | 257/296 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0045703 A1* | 3/2007 | Choi | 257/308 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0146008 A1 | 6/2007 | Tak et al. | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0121960 A1* | 5/2008 | Ohuchi | 257/296 |
| 2008/0128689 A1 | 6/2008 | Lee et al. | |
| 2008/0129195 A1 | 6/2008 | Ishizaki et al. | |
| 2008/0149913 A1 | 6/2008 | Tanaka et al. | |
| 2008/0166834 A1 | 7/2008 | Kim et al. | |
| 2008/0175032 A1 | 7/2008 | Tanaka et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0038709 A1 | 2/2010 | Wang et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101356 A1 | 5/2011 | Yamazaki | |
| 2011/0121284 A1 | 5/2011 | Yamazaki et al. | |
| 2011/0122670 A1 | 5/2011 | Yamazaki et al. | |
| 2011/0127526 A1 | 6/2011 | Kawae et al. | |
| 2011/0205777 A1 | 8/2011 | Kajigaya | |
| 2011/0260169 A1* | 10/2011 | Umezaki et al. | 257/59 |
| 2011/0284947 A1 | 11/2011 | Kito et al. | |
| 2011/0287597 A1 | 11/2011 | Kito et al. | |
| 2012/0033483 A1 | 2/2012 | Koyama | |
| 2012/0049184 A1* | 3/2012 | Umezaki et al. | 257/43 |
| 2012/0056860 A1* | 3/2012 | Umezaki et al. | 345/205 |
| 2012/0187417 A1* | 7/2012 | Yamazaki et al. | 257/77 |
| 2012/0187475 A1* | 7/2012 | Yamazaki et al. | 257/330 |
| 2012/0193696 A1* | 8/2012 | Fukushima | 257/306 |
| 2012/0199842 A1* | 8/2012 | Takemura | 257/76 |
| 2012/0228688 A1* | 9/2012 | Matsubayashi | 257/296 |
| 2012/0248434 A1* | 10/2012 | Kato et al. | 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |

(56) References Cited

FOREIGN PATENT DOCUMENTS

| | | |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-094027 | 3/2002 |
| JP | 2002-289859 A | 10/2002 |
| JP | 2003-086000 A | 3/2003 |
| JP | 2003-086808 A | 3/2003 |
| JP | 2003-152086 | 5/2003 |
| JP | 2004-103957 | 4/2004 |
| JP | 2004-273614 A | 9/2004 |
| JP | 2004-273732 A | 9/2004 |
| WO | WO-2004/114391 | 12/2004 |

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology.", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(AnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal Of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal ff Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '9 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) Sep. 13, 2004, vol. 85, No. 11, pp. 1993-1995.

Li.0 et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss For White Tandem Oleds,", SID Digest '09 : SID International Symposium Digest of Technical Papers, May 31, 2009, vol. 40, 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society Of Applied Physics.

Jeong.J et al., "3.1: Distinguished Paper: 12.1-Inch WXGA Amoled Display Driven by Indium-Gallium-Zinc Oxide TFTs Array,", SID Digest '08 : SID International Symposium Digest Of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA Amoled Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission Amoled Display on Plastic Film and its Bending Properties,", SID Digest '09 : SID International Symposium Digest of Technical Papers, May 31, 2009, pp. 983-985.

Sakata.J et al., "Development of 4.0-IN, Amoled Display with Driver Circuit using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and their Application for Large Size Amoled,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous IN-GA-ZN-Oxide FTF,", AM-FPD '09 Digest of Technical Papers, Jul. 1, 2009, pp. 41-44.

Osada.T et al., "Development of Driver-Integrated Panel using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

Ohara.H et al., "21.3:4.0 IN. QVGA Amoled Display using IN-GA-ZN-Oxide TFTS with a Novel Passivation Layer,", SID Digest '09 : SID International Symposium Digest of Technical Papers, May 31, 2009, pp. 284-287.

Miyasaka.M, "SUFTLA Flexible Microelectronics on their way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest ff Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA Or AL; B; MG, MN, FE, NI, CU, Or ZN] at Temperatures Over 1000°C., ", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review, A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review, B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal Of Applied Physics), 2008, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure To Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies In ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review, B), 2008, vol. 77, pp. 245202-1-245202-6.

Orita.M at al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol, B. (Journal f Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 with Sputtered Al2O3 Gate Insulator,", Appl. Phys. Lett. (Applied Physics Letters), Sep. 1, 2003, vol. 83, No. 9, pp. 1755-1757.

* cited by examiner

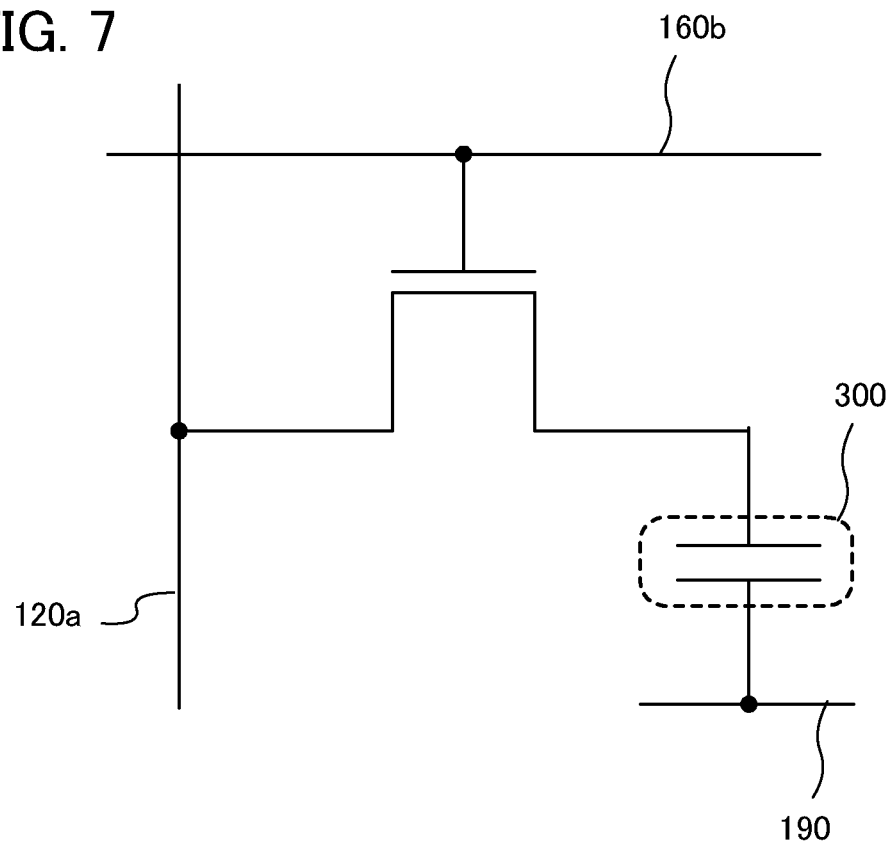

FIG. 9A
FIG. 9B
FIG. 9C
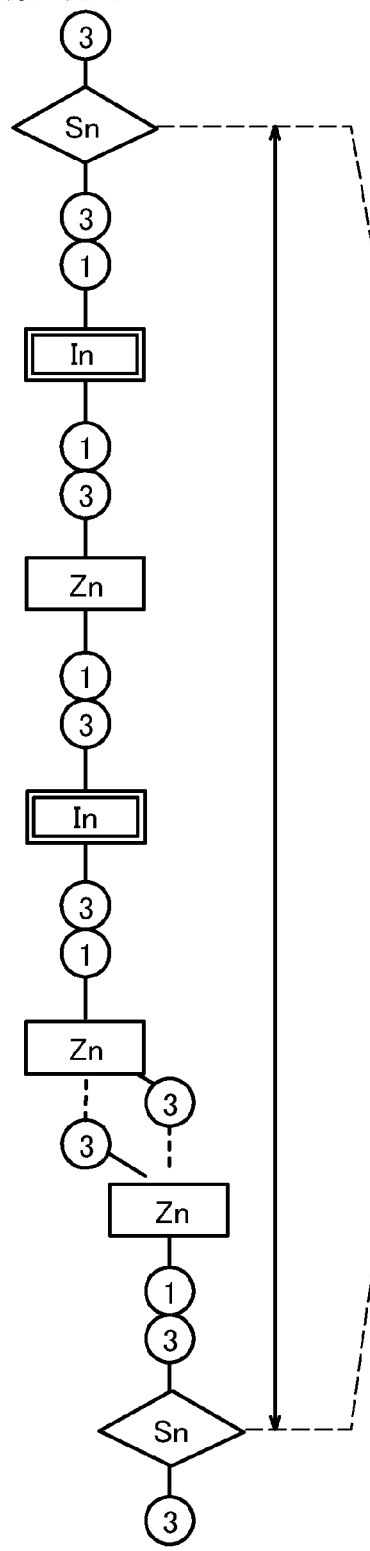
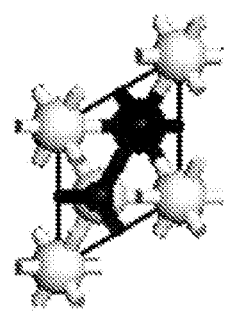
● In
☾ Sn
☽ Zn
• O

FIG. 10A  FIG. 10B
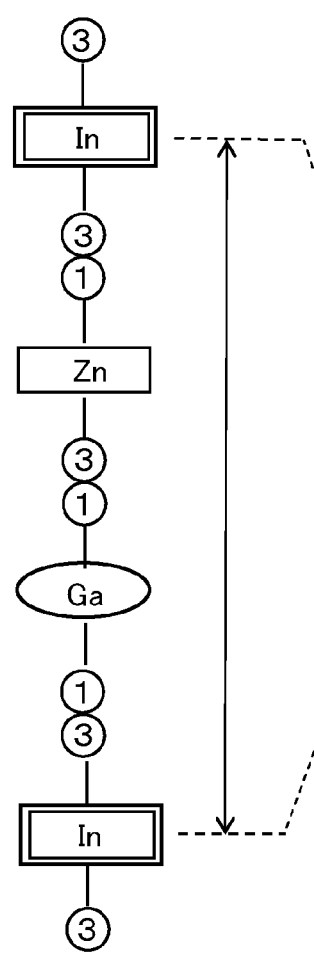
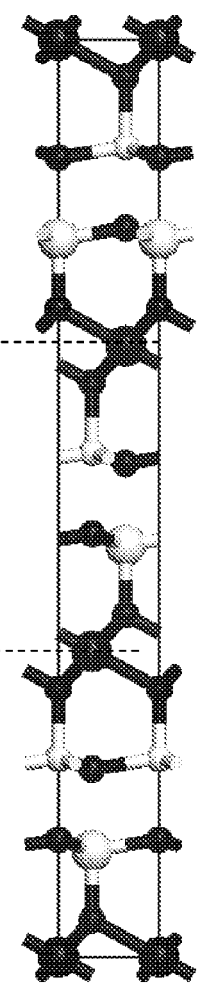
FIG. 10C
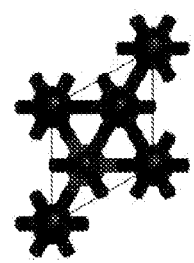
● In
● Ga
● Zn
● O

MEMORY DEVICE

BACKGROUND OF THE INVENTION

1. Field of the Invention

The present invention relates to a memory device using semiconductor characteristics.

2. Description of the Related Art

Dynamic random access memory (DRAM) with a memory cell including one capacitor and one transistor (also referred to as a cell transistor) is widely used as a typical memory device.

Note that in this specification, a memory cell indicates a circuit configuration needed for holding a minimum unit of data, and a memory device indicates a semiconductor device including at least integrated memory cells.

A planar transistor has been conventionally used to form a DRAM; however, a method using a recessed channel array transistor (RCAT) in which a gate is arranged three-dimensionally so as to prevent leakage current due to a short-channel effect caused by miniaturization of a circuit is now employed (see Non-Patent Document 1).

REFERENCE

[Non-Patent Document] K. Kim, "Technology for sub-50 nm DRAM and NAND flash manufacturing", *Technical Digest of International Electron Devices Meeting*, pp. 333-336, 2005.

SUMMARY OF THE INVENTION

Thus, when data is read from conventional DRAM, electric charge in a capacitor is lost, so that another writing operation is necessary whenever data is read. In addition, leakage current flows in a transistor included in a memory element and electric charge stored in the capacitor flows or an electric charge flows into the capacitor even if the transistor is not selected, whereby data retention period is short. Thus, there has been a problem in that operation for writing data again in a predetermined cycle (refresh operation) is needed.

On the other hand, reduction in area occupied by a memory cell is required because capacity of a memory device becomes larger. The forementioned planar transistor and an RCAT which is a modification of the planar transistor can achieve higher integration density by reduction in width between wirings in a circuit; however, it is difficult to use them in practice because of technical problems. In addition, it is expected to reduce the occupied area by change in structure. The area of a memory cell is now larger than or equal to $8F^2$ (F: minimum feature size) or larger than or equal to $6F^2$. If a memory cell with a size of $4F^2$ can be formed, for example, the area occupied by a memory device can be reduced.

The present invention is made in view of such a technical background. An object of the present invention is to provide a memory device where an area occupied by a memory cell is small. Another object of the present invention is to provide a memory device where an area occupied by a memory cell is small and a data holding period is extremely long.

An embodiment of the present invention disclosed in this specification relates to a memory device where an area occupied by a memory cell is reduced in such a manner that a vertical cell transistor is formed using the side portion of a groove portion formed in an insulating layer.

An embodiment of the present invention disclosed in this specification is a memory device which includes a bit line, a capacitor, a first insulating layer provided over the bit line and including a groove portion, a semiconductor layer, a second insulating layer in contact with the semiconductor layer, and a word line in contact with the second insulating layer. Part of the semiconductor layer is electrically connected to the bit line in a bottom portion of the groove portion, and another part of the semiconductor layer is electrically connected to one electrode of the capacitor in a top surface of the first insulating layer.

It is to be noted that the ordinal numbers such as "first" and "second" in this specification, etc. are assigned in order to avoid confusion among components, but not intended to limit the number or order of the components.

The depth of the groove portion is preferably 2 to 20 times as much as the width of the groove portion.

The semiconductor layer is preferably formed using a material with a band gap of greater than or equal to 2.5 eV and smaller than or equal to 4 eV. For example, an oxide semiconductor can be used. A transistor which includes the semiconductor layer for its channel formation region has an extremely low off-state current characteristic. Accordingly, the amount of electric charge flowing out from a capacitor and flowing therein is small, and a data holding period can be longer. In other words, refresh operations in a predetermined time can be reduced.

A driver circuit for driving a cell transistor is preferably provided below the bit line. In that case, an occupied area can be reduced. The driver circuit is preferably formed using a single crystal semiconductor.

Electrical connection between the bit line and part of the semiconductor layer and electrical connection between the electrode and another part of the semiconductor layer may be connection with a conductive layer provided therebetween.

With use of an embodiment of the present invention, a memory device where an area occupied by a memory cell is small can be provided. Further, a memory device where an area occupied by a memory cell is small and a data holding period is extremely long can be provided.

BRIEF DESCRIPTION OF THE DRAWINGS

FIG. 7 is an equivalent circuit diagram of a memory cell.

FIGS. 9A to 9C are examples of an oxide semiconductor.

FIGS. 10A to 10C are examples of an oxide semiconductor.

DETAILED DESCRIPTION OF THE INVENTION

Figure 1A:
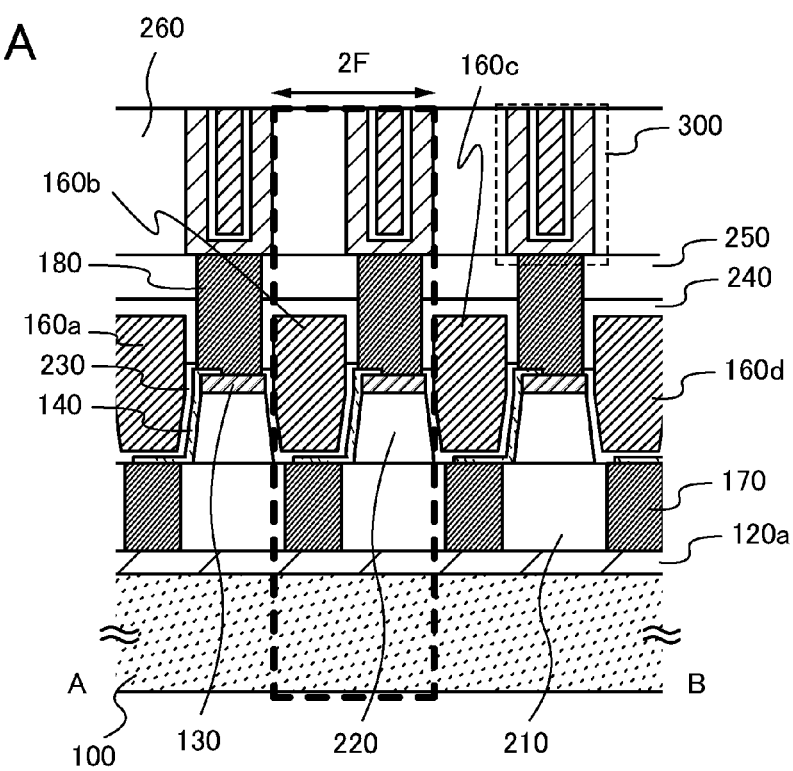
FIGS. 1A and 1B illustrate a memory device in an embodiment of the present invention.

Embodiments will be described in detail with reference to the accompanying drawings. Note that the present invention is not limited to the following description, and it will be easily understood by those skilled in the art that various changes and modifications can be made without departing from the spirit and scope of the invention. Therefore, the present invention should not be limited to the descriptions of the embodiments below. Note that, in the structures of the invention described below, in some cases, the same portions or portions having similar functions are denoted by the same reference numerals in different drawings, and the descriptions of such portions are not repeated.

Note that in each drawing described in this specification, the size, the layer thickness, or the region of each component is exaggerated for clarity in some cases. Therefore, embodiments of the present invention are not limited to such scales.

In addition, in this specification, a source of a cell transistor denotes an electrode or a region on the bit line side, and a drain of a cell transistor denotes an electrode or a region on the capacitor side.

(Embodiment 1)

In this embodiment, an example of a structure of a memory cell and a structure a memory device which are embodiments of the present invention will be described. Note that although a drawing illustrating part of a memory device is used for description in this embodiment, the number of bit lines and the number of word lines are not necessarily the ones defined in the description, and practitioners can set them freely.

Figure 1B:
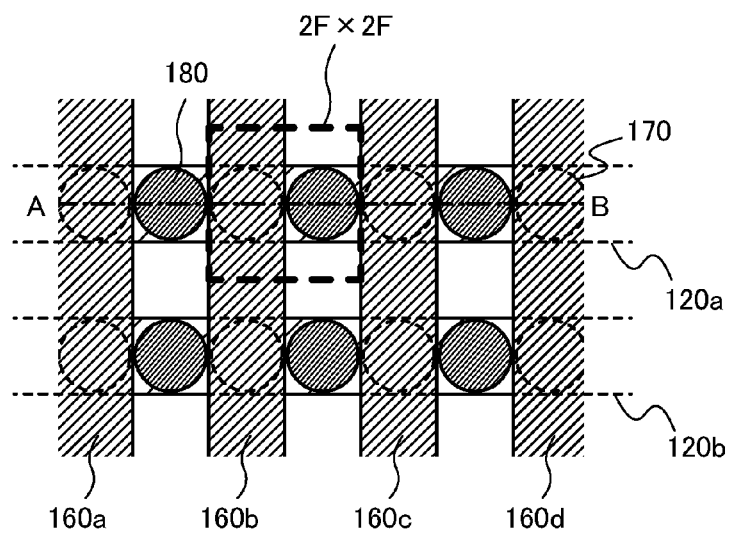

FIG. 1B illustrates part of a top view of a memory device in an embodiment of the present invention. A schematic structure is shown by a bit line 120a, a bit line 120b, a word line 160a, a word line 160b, a word line 160c, a word line 160d, a contact plug 170, and a contact plug 180. The other components are not shown for the sake of clarity.

FIG. 1A is a cross-sectional view of the memory device taken along line A-B in FIG. 1B. The memory device includes over a substrate 100, the bit line 120a; a first insulating layer 210 formed over the bit line; the contact plug 170 embedded in the first insulating layer and electrically connected to the bit line; a second insulating layer 220 formed over the first insulating layer and having a groove portion; an electrode 130 formed over the top surface of the second insulating layer; a semiconductor layer 140 electrically connected to the electrode and the contact plug 170; a third insulating layer 230 covering the semiconductor layer; word lines 106a to 106d; a fourth insulating layer 240 formed over each of the word lines and the third insulating layer; a fifth insulating layer 250 formed over the fourth insulating layer; the contact plug 180 embedded in the fourth insulating layer and the fifth insulating layer and electrically connected to the electrode 130; a sixth insulating layer 260 formed over the fifth insulating layer; and a capacitor 300 which is provided in a groove portion formed in the sixth insulating layer and which has electrodes one of which is electrically connected to the contact plug 180. Note that although not illustrated here, the other electrode of the capacitor 300 is electrically connected to a capacitor line.

A memory device in an embodiment of the present invention includes a plurality of bit lines provided in parallel and a plurality of word lines perpendicular to the bit lines. A memory cell with a size of 2F×2F (4F$^2$) is formed in a region where one of the bit lines and one of the word lines overlap with each other and in the vicinity of the region. In the region of the memory cell, a cell transistor and a capacitor are formed to be stacked. A memory cell including the word line 160b will be described below in detail. The structure of the memory cell is surrounded by a bold dotted line in FIGS. 1A and 1B.

As the substrate 100, a glass substrate, a quartz substrate, a semiconductor substrate, a ceramic substrate, or the like can be used, for example. When a semiconductor substrate such as a single crystal silicon substrate is used, a driver circuit for driving the cell transistor can be provided under the memory cell. In that case, the area of the memory device can be small.

The cell transistor includes the semiconductor layer 140, the third insulating layer 230 serving as a gate insulating film, the contact plug 170 serving as a source electrode, the electrode 130 and/or the contact plug 180 serving as a drain electrode, and the word line 160b serving as a gate electrode. Here, the semiconductor layer 140 is formed to cover part of the side portion of the groove portion provided in the second insulating layer 220. Most part of the semiconductor layer 140 covering the side portion of the groove portion is made to be a channel formation region. With such a structure, a channel length can be longer while the substantial occupied area of a transistor can be reduced, and short channel effect can be suppressed. Note that in order to suppress short channel effect more effectively, the depth of a groove portion provided in the second insulating layer 220 is preferably 2 times to 20 times as much as the width of the groove portion.

Here, the contact plug 170 serving as a source electrode may be omitted, and the semiconductor layer 140 may be in direct contact with the bit line 120a to form a source region. Further, the electrode 130 may be omitted, and only the contact plug 180 may be in contact with the semiconductor layer 140 to form a drain region.

The upper portion of the word line 160b is covered with the fourth insulating layer 240 and the word line 160b is insulated from the contact plug 180. Further, the top surface of the contact plug 180 is electrically connected to the one of electrodes of the capacitor. Here, the widths of the word line 160b, the bit line 120a, and the capacitor 300 are approximately equal to one another. When the widths of the word line 160b, the bit line 120a, and the capacitor 300 each have a minimum feature size (F), the area occupied by a memory cell can be as extremely small as 2F×2F (4F$^2$).

A transistor having extremely low off-state current is used as a cell transistor, so that electric charge can be held in the capacitor 300 for a long time. Accordingly, in the memory device, refresh operation at regular intervals is not needed or the frequency of performing refresh operation can be dramatically reduced. That is, the memory device can substantially serve as a non-volatile memory device.

The capacitance of the capacitor 300 can be lower as the off-state current of the cell transistor is lower, that is, as the off resistance of the cell transistor is higher.

An example of a transistor having extremely low off-state current is a transistor in which a semiconductor having a wider band gap than silicon is used for a channel formation region. As a semiconductor having a wider band gap than silicon, a compound semiconductor is given. Well-known examples of the compound semiconductor are an oxide semiconductor, a nitride semiconductor, and the like.

Specifically, in order to obtain such an extremely high off resistance, silicon (whose band gap is 1.1 eV) is not enough.

It is necessary to use a wide band gap semiconductor whose band gap is greater than or equal to 2.5 eV and less than or equal to 4 eV, preferably greater than or equal to 3 eV and less than or equal to 3.8 eV. For example, for the semiconductor layer 140 in which a channel is formed, an oxide semiconductor such as indium oxide or zinc oxide, a nitride semiconductor such as gallium nitride, a sulfide semiconductor such as zinc sulfide, or the like can be used.

The off resistance of a semiconductor layer, in which a channel is formed, of a transistor is inversely proportional to the concentration of carriers excited thermally. Since the band gap of silicon is 1.1 eV even when carriers caused by a donor or an acceptor do not exist at all (intrinsic semiconductor), the concentration of carriers excited by heat at room temperature (300 K) is approximately $1 \times 10^{11}$ cm$^{-3}$.

On the other hand, the concentration of thermally excited carriers of a semiconductor having a band gap of 3.2 eV is approximately $1 \times 10^{-7}$ cm$^{-3}$. When the electron mobility is the same, the resistivity is inversely proportional to the carrier concentration, so that the resistivity of the semiconductor whose band gap is 3.2 eV is 18 orders of magnitude higher than that of silicon.

A cell transistor including such a wide band gap semiconductor has extremely low off-state current and therefore the capacitor 300 holding electric charge can be downsized.

As described above, a memory device described in this embodiment as an example has a memory cell occupying a very smaller area with respect to the surface of the substrate 100. Further, when a cell transistor has extremely low off-state current, a memory device with an extremely long data holding period can be achieved.

FIG. 7 illustrates an equivalent circuit of a memory cell including the bit line 120a and the word line 160b. When data is written to the memory cell, a potential at which the cell transistor is turned on is supplied to the word line 160b, and the capacitor 300 is charged by current flowing owing to a potential difference between the bit line 120a and a capacitor line 190. After that, the cell transistor is turned off, whereby the written data can be held.

Further, when data is read, a potential at which the cell transistor is turned on is supplied to the word line 160b to establish conduction between the bit line 120a and the capacitor 300 and then electric charge is distributed again between the parasitic capacitance of the bit line 120a (bit line capacitance) and the capacitor 300. As a result, the potential of the bit line 120a is changed. Then, by comparing the potential of the bit line 120a with a predetermined potential, data can be read.

This embodiment can be combined with any of the other embodiments disclosed in this specification as appropriate.

(Embodiment 2)

In this embodiment, a method for manufacturing the semiconductor memory device described in Embodiment 1 as an example is described. Note that the drawing used for the description is a cross-sectional view taken along line A-B in FIG. 1B.

Figure 2A:
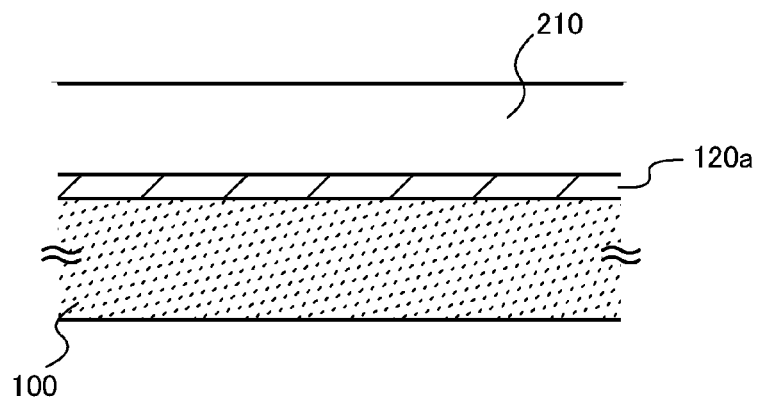
FIGS. 2A to 2D illustrate a method for manufacturing a memory device in an embodiment of the present invention.

First, the bit line 120a is formed over the substrate 100, and the first insulating layer 210 is formed over the substrate and the bit line (see FIG. 2A).

Although there is no particular limitation on a material which can be used as the substrate 100, it is necessary that the material have at least heat resistance high enough to withstand heat treatment to be performed later. For example, the substrate 100 may be a glass substrate, a quartz substrate, a semiconductor substrate, a ceramic substrate, or the like. When the temperature of the heat treatment performed later is high, a substrate having a strain point of 730° C. or higher is preferably used as the glass substrate. Here, a glass substrate is used.

Note that an insulating layer serving as a base film may be provided over the substrate 100. The base film has a function of preventing diffusion of an impurity from the substrate 100. For example, an oxide insulating film, a nitride insulating film, or the like can be formed by various deposition methods such as a plasma CVD method and a sputtering method. Further, when a semiconductor substrate is used as the substrate 100, thermal oxidation may be performed on the surface.

The bit line 120a can be formed in such a manner that a conductive film is formed by a deposition method such as a sputtering method and then subjected to a known photolithography method and a known etching method.

As a material of the conductive film, an element selected from aluminum, chromium, copper, tantalum, titanium, molybdenum, and tungsten, an alloy containing any of these elements as a component, an alloy containing any of these elements in combination, or the like can be given. Further, the conductive film may have a single-layer structure or a stacked-layer structure of two or more layers. Alternatively, a structure may be employed in which a film of a refractory metal such as chromium, tantalum, titanium, molybdenum, or tungsten is stacked over and/or below a metal film of aluminum, copper, or the like. Further, one or more materials selected from manganese, magnesium, zirconium, beryllium, neodymium, and scandium may be used.

A material which can be used for the first insulating layer 210 is not limited to a particular material. For example, an oxide insulating film, a nitride insulating film, or the like may be used. The insulating film can be formed by various deposition methods such as a plasma CVD method, a sputtering method, or the like.

Figure 2B:
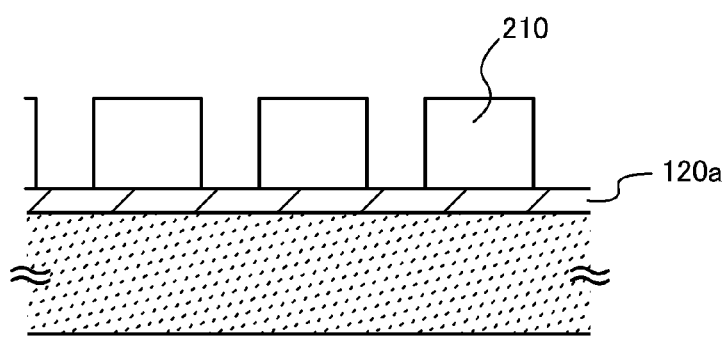

Next, a contact hole reaching part of the bit line 120a is formed in the first insulating layer 210 (see FIG. 2B). The contact hole can be formed by a known photolithography method and a known etching method.

Figure 2C:
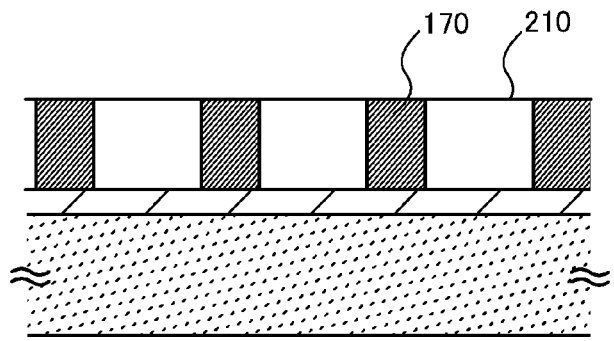

Next, a conductive film is formed to fill a contact hole formed in the first insulating layer 210. The conductive film can be formed using a material similar to that of the bit line 120a and can be formed by a deposition method such as a sputtering method. Unnecessary part of the conductive film on the surface of the first insulating layer 210 is removed by planarization treatment such as chemical mechanical polishing (CMP), so that the contact plug 170 filling the contact hole is formed (see FIG. 2C).

Figure 2D:
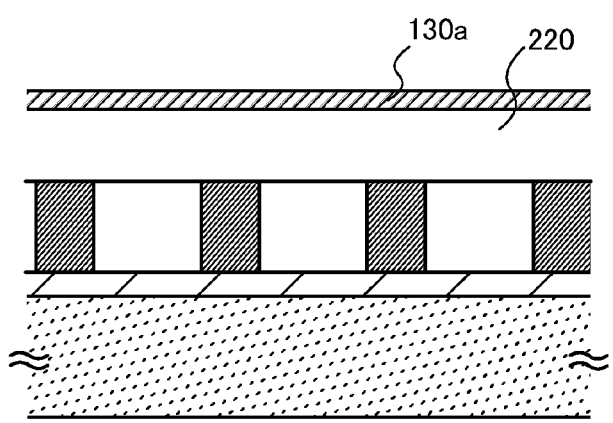

Next, the second insulating layer 220 is formed over the first insulating layer 210 and the contact plug 170, and a conductive film 130a is formed over the second insulating layer 220 (see FIG. 2D). The second insulating layer and the conductive film can be formed by various deposition methods such as a plasma CVD method and a sputtering method.

An insulating layer containing oxygen is preferably used as the second insulating layer 220. For example, the second insulating layer 220 can be formed to have a single-layer structure or a stacked-layer structure using any of silicon oxide, silicon nitride, gallium oxide, gallium zinc oxide, silicon oxynitride, silicon nitride oxide, aluminum oxide, aluminum nitride, aluminum oxynitride, aluminum nitride oxide, and hafnium oxide, or a mixed material of them. An insulating layer containing oxygen is used as the second insulating layer 220, so that oxygen deficiency of an oxide semiconductor layer, which is described later, can be compensated easily.

Further, the conductive film 130a to be the electrode 130 can be formed using a conductive material similar to that of the bit line 120a and can be formed by a deposition method such as a sputtering method.

Figure 3A:
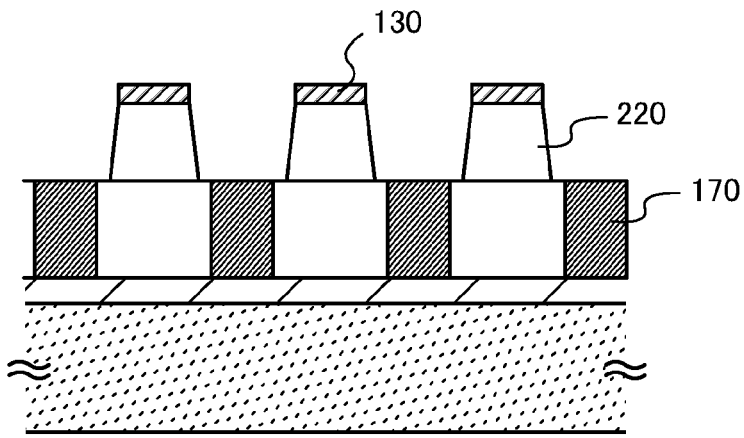
FIGS. 3A to 3C illustrate a method for manufacturing a memory device in an embodiment of the present invention.

Next, the conductive film 130a and the second insulating layer 220 are processed by a known photolithography method and a known etching method, so that the groove portion is formed in the second insulating layer. The electrode 130 is formed over the top surface of the second insulating layer (see FIG. 3A). At that time, the top surface of the contact plug 170 is exposed at the bottom portion of the groove portion.

Next, a semiconductor film is formed to cover the top surface of the second insulating layer 220 and the groove portion provided in the second insulating layer 220.

For example, in this embodiment, an In—Ga—Zn—O-based oxide semiconductor film is formed using an In—Ga—Zn—O-based oxide semiconductor target by a sputtering method.

A material which can be used as the oxide semiconductor film is not limited to the above and includes at least one element selected from In, Ga, Sn, and Zn. For example, an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, or a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or an oxide of one metal element, such as an In—O-based oxide semiconductor, a Sn—O-based oxide semiconductor, or a Zn—O-based oxide semiconductor can be used. Further, any of the above oxides may contain an element other than In, Ga, Sn, and Zn, for example, Si.

For example, an In—Ga—Zn—O-based oxide semiconductor means an oxide film containing indium (In), gallium (Ga), and zinc (Zn), and there is no limitation on the composition ratio thereof. As the film formation target used when the In—Ga—Zn—O-based oxide semiconductor film by a sputtering method, metal oxide with the following composition ratio of $In_2O_3:Ga_2O_3:ZnO=1:1:1$ [molar ratio] is used. Alternatively, metal oxide with the following composition ratio may be used: the composition ratio of $In_2O_3:Ga_2O_3:ZnO$ is 1:1:2 [molar ratio].

In addition, as the oxide semiconductor film, a thin film of a material represented by the chemical expression, $InMO_3(ZnO)_m$ (m>0), can be used. Here, M represents one or more metal elements selected from Zn, Ga, Al, Mn, and Co. For example, M can be Ga, Ga and Al, Ga and Mn, Ga and Co, or the like.

In the case where an In—Zn—O-based material is used as the oxide semiconductor, a target used has a composition ratio of In:Zn=50:1 to 1:2 in an atomic ratio ($In_2O_3:ZnO=25:1$ to 1:4 in a molar ratio), preferably In:Zn=20:1 to 1:1 in an atomic ratio ($In_2O_3:ZnO=10:1$ to 1:2 in a molar ratio), further preferably In:Zn=15:1 to 1.5:1 ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

Here, the oxide semiconductor film is preferably formed not to contain impurities such as an alkali metal, hydrogen atoms, hydrogen molecules, water, a hydroxyl group, and a hydrogen compound as much as possible. For example, the above impurities are prevented from entering a deposition gas and a target for depositing the film by sputtering. Further, in the deposition, a gas is exhausted from a deposition apparatus and a substrate is heated while the film is formed. Accordingly, the concentration of impurities contained in the deposited oxide semiconductor film can be reduced. Heating treatment may be performed on the oxide semiconductor film to release moisture and hydrogen in the oxide semiconductor film. Note that the heat treatment may be performed any time after the oxide semiconductor film is formed.

Then, the semiconductor layer 140 is formed by processing the semiconductor film using a known photolithography method and a known etching method. At this time, part of the semiconductor layer 140 is electrically connected to the contact plug 170 in the bottom portion of the groove portion, and another part of the semiconductor layer 140 is electrically connected to the electrode 130.

Figure 3B:
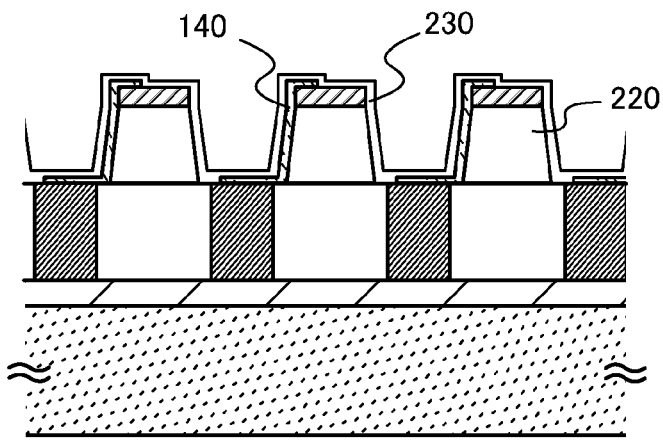

Then, the third insulating layer 230 serving as a gate insulating film is formed to cover the groove portion provided in the second insulating layer 220, the electrode 130 provided over the top surface of the second insulating layer 220, and the semiconductor layer 140 (see FIG. 3B). The third insulating layer 230 may have a single layer structure or a stacked layer structure of any insulating film of silicon oxide, silicon oxynitride, silicon nitride oxide, aluminum oxide, gallium oxide, gallium aluminum oxide, gallium zinc oxide, aluminum oxynitride, aluminum nitride oxide, hafnium oxide, tantalum oxide, yttrium oxide, hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or the like.

Figure 3C:
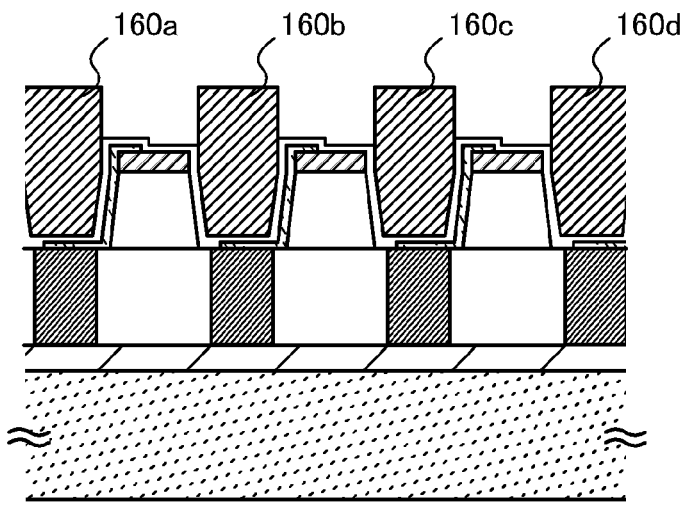

Next, a conductive film is formed by a deposition method such as a sputtering method to fill the groove portion where the third insulating layer 230 is formed. For the conductive film, the material similar to that of the bit line 120a can be used. Then, the word lines 160a to 160d are formed by processing the conductive film using a known photolithography method and a known etching method (see FIG. 3C). Note that in FIG. 3C, the top surface of the word line has a flat surface but may be a depressed shape or a projected shape.

Here, the cell transistor with the following structure is formed: a region in which the semiconductor layer 140 is in contact with the contact plug 170 is a source region, a region in which the semiconductor layer 140 is in contact with the electrode 130 is a drain region, the third insulating layer 230 is a gate insulating film, the word lines 160a to 160d are gate electrodes, and most part of the semiconductor layer 140 formed on the side portion of the second insulating layer 220 is a channel formation region.

Figure 4A:
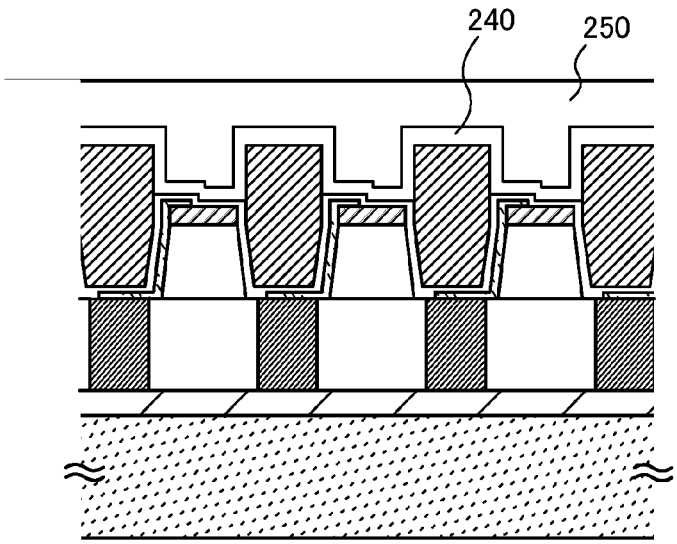
FIGS. 4A to 4C illustrate a method for manufacturing a memory device in an embodiment of the present invention.

Next, the fourth insulating layer 240 is formed to cover exposed regions of the word lines 160a to 160d. Further, the fifth insulating layer 250 is formed over the fourth insulating layer 240 (see FIG. 4A). The fourth insulating layer 240 and the fifth insulating layer 250 can be formed using the material similar to that of the second insulating layer 220 and can be formed by various deposition methods such as a plasma CVD method and a sputtering method.

Note that in order not to expose the word lines 160a to 160d in a later step of forming a contact hole, a material with a low etching rate and a material with a high etching rate are used for the fourth insulating layer 240 and the fifth insulating layer 250, respectively in the same etching method.

Figure 4B:
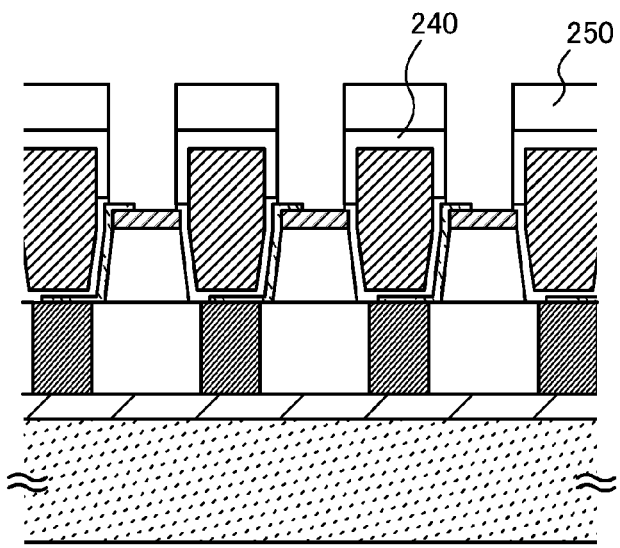

Next, a contact hole is formed in the fourth insulating layer 240 and the fifth insulating layer 250 by a known photolithography method and a known etching method, so that parts of the electrode 130 and the semiconductor layer 140 are exposed (see FIG. 4B). Note that only part of the electrode 130 or only part of the semiconductor layer 140 may be exposed. In FIG. 4B, only the fourth insulating layer 240 remains on the side surfaces of the word lines 160a to 160d; however, part of the fifth insulating layer 250 may also remain therein.

Figure 4C:
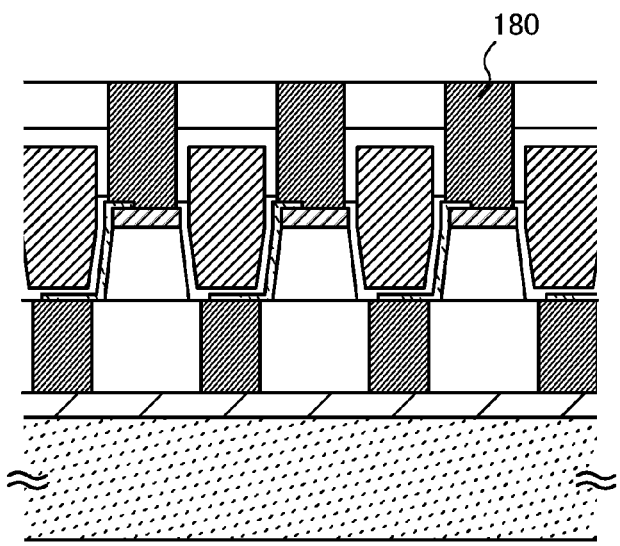

Then, a conductive film is formed to fill the contact hole. The conductive film may be formed using a material similar to that of the bit line 120a and formed by a deposition method such as a sputtering method. Unnecessary part of the conductive film on the fifth insulating layer 250 is removed by planarization treatment such as chemical mechanical polishing (CMP), so that the contact plug 180 filling the contact hole is formed (see FIG. 4C).

Here, when the contact plug 180 is in contact with the semiconductor layer 140 in the bottom portion of a contact hole, the contact region serves as the drain region of the cell transistor. In that case, the electrode 130 may be omitted.

Figure 5A:
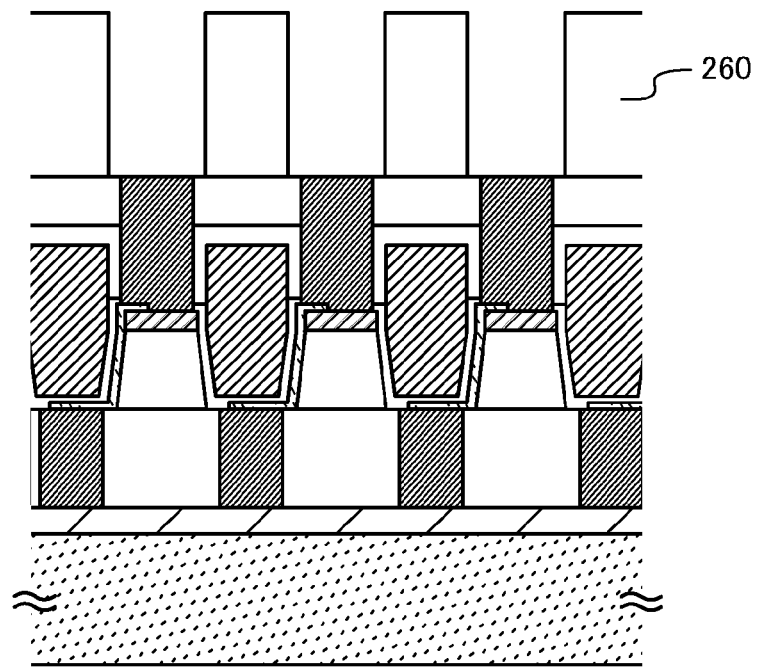
FIGS. 5A and 5B illustrate a method for manufacturing a memory device in an embodiment of the present invention.

Next, the sixth insulating layer 260 is formed over the fifth insulating layer 250 and the contact plug 180. The sixth insulating layer 260 can be formed using a material similar to that of the second insulating layer 220 and formed by various deposition methods such as a plasma CVD method and a sputtering method. The groove portion is formed in the sixth insulating layer 260 by a known photolithography method and a known etching method (see FIG. 5A).

Figure 5B:
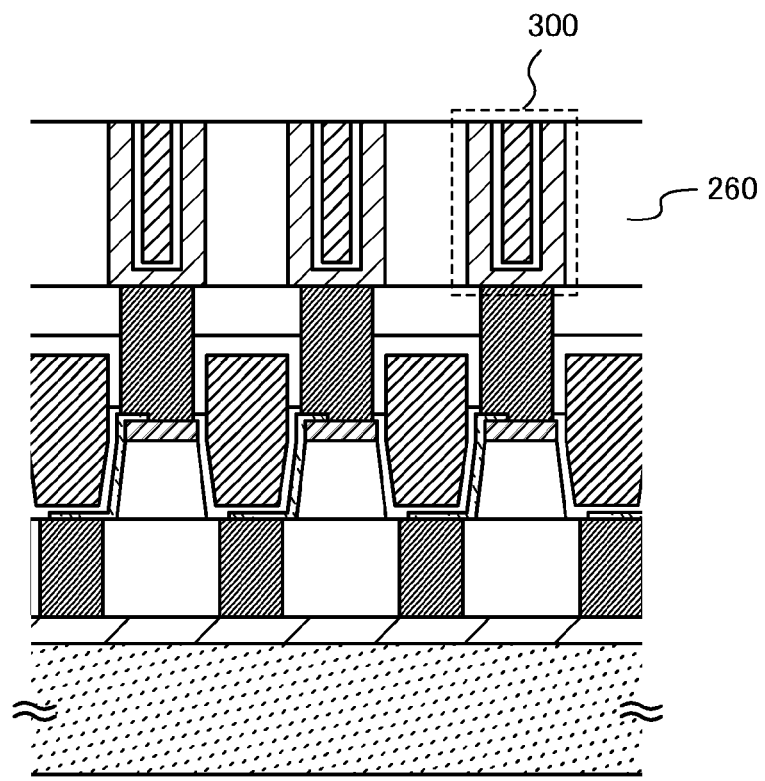

Next, the capacitor 300 is formed in the groove portion (see FIG. 5B). The capacitor 300 includes one electrode in contact with the side portions of the groove portion and the other electrode facing the one electrode with a dielectric layer provided therebetween. These components fill the groove portion. Here, in the bottom portion of the groove, the one electrode of the capacitor 300 is electrically connected to the contact plug 180 and the other electrode is connected to the capacitor line (not illustrated). Note that a material included in the capacitor 300 is not particularly limited. For example, a material similar to that of the bit line 120a can be used for the one electrode and the other electrode, and a material similar to that of the second insulating layer 220 can be used for the dielectric layer.

Through the above steps, a memory device including a plurality of memory cells with a dramatically reduced occupied area with respect to a substrate surface can be formed. A memory device manufactured through those steps can have an extremely long data holding period; accordingly, the memory device where refresh operation is unnecessary or the frequency of performing refresh operation is extremely low can be achieved.

This embodiment can be combined with any of the other embodiments disclosed in this specification as appropriate.

(Embodiment 3)

In this embodiment, an example of a memory device in which memory cells described in Embodiments 1 and 2 are stacked over a substrate with which a semiconductor circuit is formed will be described.

Figure 6:
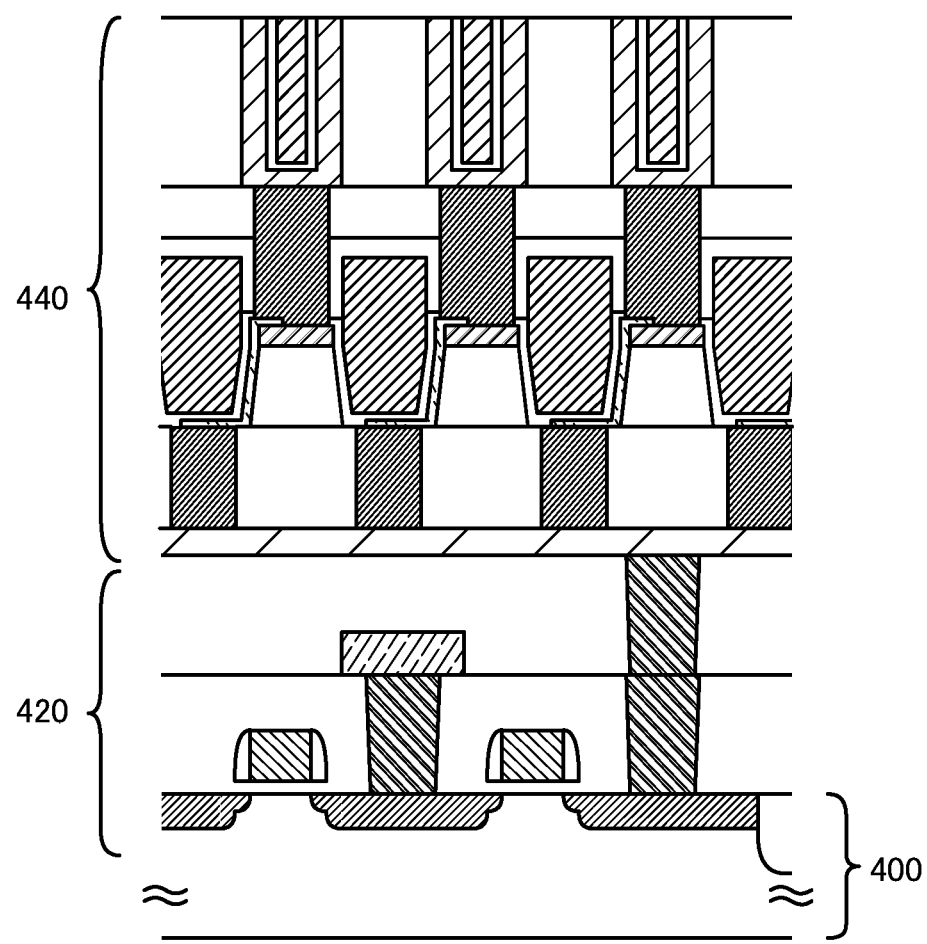
FIG. 6 illustrates a memory device in an embodiment of the present invention.

FIG. 6 is a cross-sectional view of a memory device where a memory cell portion is stacked over a semiconductor substrate where a driver circuit portion is formed. In the memory device, a driver circuit portion 420 for driving a memory cell such as a sense amplifier or a decoder is formed on a single crystal semiconductor substrate 400 by a known technique for forming a semiconductor integrated circuit. A memory cell portion 440 can be manufactured by referring to Embodiment 2.

A bit line connected to the cell transistor is electrically connected to the driver circuit portion 420 provided in a lower layer through a contact plug or the like. Accordingly, a potential signal output from the driver circuit portion 420 is input to each cell transistor through a common bit line.

Further, although not illustrated here, a word line serving as a gate electrode of the cell transistor is electrically connected to the driver circuit portion 420 through a contact plug or the like, similar to the bit line. Accordingly, on/off of the cell transistor is controlled in accordance with the potential output from the driver circuit portion 420.

With such a structure, the cell transistor of the memory device can be controlled by the driver circuit portion 420 provided therebelow.

As thus described, the memory cell portion 440 is stacked over the driver circuit portion 420 formed using the single crystal semiconductor substrate 400, so that a highly integrated memory device can be achieved.

Note that one or more of memory cell portions may be further stacked over the memory cell portion 440 of the memory device illustrated in FIG. 6 with an insulating layer provided therebetween. With such a structure, a memory device which is much highly integrated can be obtained.

This embodiment can be implemented in an appropriate combination with any of the other embodiments described in this specification and the like.

(Embodiment 4)

Details of an oxide semiconductor will be described again.

An oxide semiconductor preferably contains at least indium (In) or zinc (Zn). In particular, In and Zn are preferably contained.

As a stabilizer for reducing variation in electric characteristics of a transistor including the oxide semiconductor, it is preferable that one or more selected from gallium (Ga), tin (Sn), hafnium (Hf), aluminum (Al), or lanthanoid be contained.

As lanthanoid, there are lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

An oxide semiconductor can be any material as long as the material having the appropriate composition may be used depending on necessary semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that the amorphous structure has many defects; therefore, a non-amorphous structure is preferred.

The contents of this embodiment or part thereof can be implemented in combination with any of the other embodiments and examples.

(Embodiment 5)

This embodiment describes a CAAC-OS (c-axis aligned crystalline oxide semiconductor) film which has an amorphous portion and a crystalline portion where crystals are aligned in the c-axis direction.

The CAAC-OS film is not completely single crystal nor completely amorphous. The CAAC-OS film is an oxide semiconductor layer with a crystal-amorphous mixed phase structure where crystalline portions are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where an oxide semiconductor layer is formed on one surface and crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal portion is formed by deposition or by performing treatment for crystallization such as heat treatment after deposition.

With use of the CAAC-OS film in a transistor, change in electric characteristics of the transistor due to irradiation with visible light or ultraviolet light can be reduced. Thus, the transistor is highly reliable.

Note that part of oxygen included in the oxide semiconductor layer may be substituted with nitrogen.

In an oxide semiconductor having a crystal portion as the CAAC-OS film, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, more preferably less than or equal to 0.1 nm.

An example of a crystal structure of the CAAC-OS film will be described with reference to FIGS. 8A to 8E, FIGS. 9A to 9C, and FIGS. 10A to 10C.

In FIGS. 8A to 8E, FIGS. 9A to 9C, and FIGS. 10A to 10C, the vertical direction corresponds to the c-axis direction and a plane perpendicular to the c-axis direction corresponds to the a-b plane.

In this embodiment, the expressions an "upper half" and a "lower half" refer to an upper half above the a-b plane and a lower half below the a-b plane, respectively.

Figure 8A:
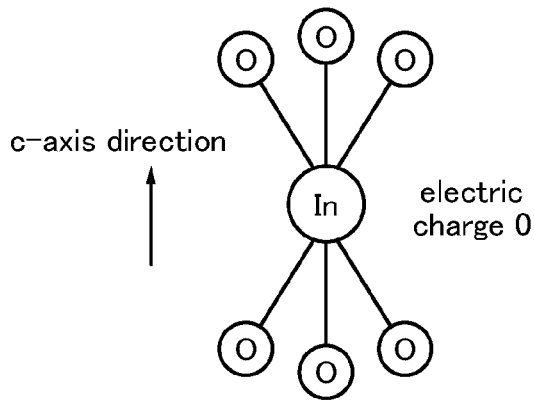
FIGS. 8A to 8E are examples of an oxide semiconductor.

FIG. 8A illustrates a structure A including one hexacoordinate In atom and six tetracoordinate oxygen (hereinafter referred to as tetracoordinate O) atoms proximate to the In atom.

Here, a structure including one metal atom and oxygen atoms proximate thereto is referred to as a small group.

The structure A is an octahedral structure, but is illustrated as a planar structure for simplicity.

Note that in the structure A, three tetracoordinate O atoms exist in each of an upper half and a lower half. In the small group of the structure A, electric charge is 0.

Figure 8D:
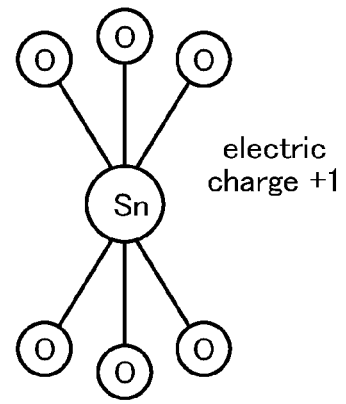
Figure 8B:
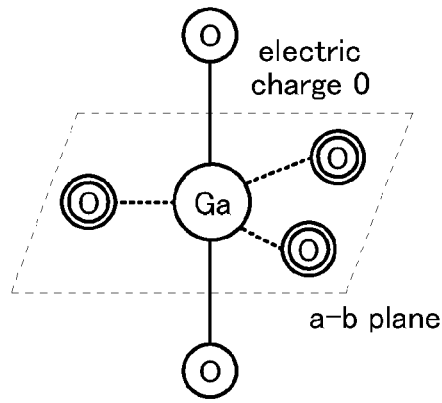

FIG. 8B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure B, one tetracoordinate O atom exists in each of an upper half and a lower half.

An In atom can also have the structure B because an In atom can have five ligands. In the small group of the structure B, electric charge is 0.

Figure 8E:
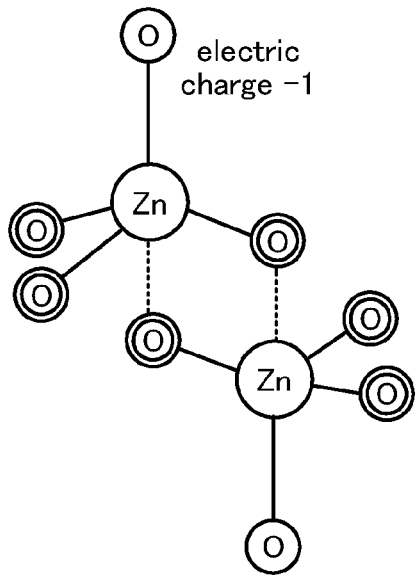
Figure 8C:
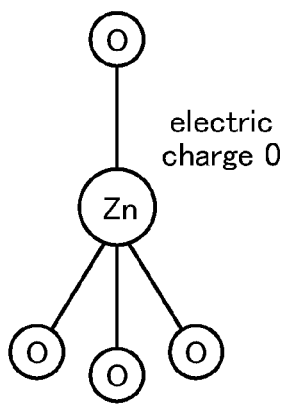

FIG. 8C illustrates a structure C including one tetracoordinate Zn atom and four tetracoordinate O atoms proximate to the Zn atom.

In the structure C, one tetracoordinate O atom exists in an upper half and three tetracoordinate O atoms exist in a lower half. In the small group of the structure C, electric charge is 0.

FIG. 8D illustrates a structure D including one hexacoordinate Sn atom and six tetracoordinate O atoms proximate to the Sn atom.

In the structure D, three tetracoordinate O atoms exist in each of an upper half and a lower half.

In the small group of the structure D, electric charge is +1.

FIG. 8E illustrates a structure E including two Zn atoms.

In the structure E, one tetracoordinate O atom exists in each of an upper half and a lower half. In the small group of the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the In atom each have three proximate In atoms in the downward direction, and the three O atoms in the lower half each have three proximate In atoms in the upward direction.

The one O atom in the upper half with respect to the pentacoordinate Ga atom has one proximate Ga atom in the downward direction, and the one O atom in the lower half has one proximate Ga atom in the upward direction.

The one O atom in the upper half with respect to the tetracoordinate Zn atom has one proximate Zn atom in the downward direction, and the three O atoms in the lower half each have three proximate Zn atoms in the upward direction.

Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded.

The reason will be described below. This is because in the case, for example, where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

FIG. 9A illustrates a model of a medium group A included in a layered structure of an In—Sn—Zn—O-based material.

FIG. 9B illustrates a large group B including three medium groups.

Note that FIG. 9C illustrates an atomic arrangement in the case where the layered structure in FIG. 9B is observed from the c-axis direction.

In the medium group A, a tricoordinate O atom is omitted, only the number of tetracoordinate O atoms is shown.

For example, three tetracoordinate O atoms existing in each of an upper half and a lower half with respect to a Sn atom are denoted by circled 3.

Similarly, in the medium group A, one tetracoordinate O atom existing in each of an upper half and a lower half with respect to an In atom is denoted by circled 1.

In addition, the medium group A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn—O-based material, in the order starting from the top, a Sn atom proximate to three tetracoordinate O atoms in each of an upper half and a lower half is bonded to an In atom proximate to one tetracoordinate O atom in each of an upper half and a lower half.

The In atom is bonded to a Zn atom proximate to three tetracoordinate O atoms in an upper half.

The Zn atom is bonded to an In atom proximate to three tetracoordinate O atoms in each of an upper half and a lower half through one tetracoordinate O atom in a lower half with respect to the Zn atom.

The In atom is bonded to a small group that includes two Zn atoms and is proximate to one tetracoordinate O atom in an upper half.

The small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1.

Therefore, electric charge of −1, which cancels +1, is needed to form a layered structure including a Sn atom.

As a structure having electric charge of −1, the small group including two Zn atoms as illustrated in the structure E can be given.

For example, with one small group including two Zn atoms, electric charge of one small group including a Sn atom can be cancelled, so that the total electric charge of the layered structure can be 0.

When the large group B is repeated, an In—Sn—Zn—O-based crystal ($In_2SnZn_3O_8$) can be obtained.

Note that a layered structure of the obtained In—Sn—Zn—O-based crystal can be expressed as a composition formula, $In_2SnZn_2O_7(ZnO)_m$ (m is 0 or a natural number).

As larger m is, the crystallinity of the In—Sn—Zn—O-based crystal is improved, which is preferable.

The same applies to the case where an oxide semiconductor used is not In—Sn—Zn—O-based one.

For example, FIG. 10A illustrates a model of a medium group included in a layered structure of an In—Ga—Zn—O-based material.

In the medium group L included in the layered structure of the In—Ga—Zn—O-based material, in the order starting from the top, an In atom proximate to three tetracoordinate O atoms in each of an upper half and a lower half is bonded to a Zn atom proximate to one tetracoordinate O atom in an upper half.

The Zn atom is bonded to a Ga atom proximate to one tetracoordinate O atom in each of an upper half and a lower half through three tetracoordinate O atoms in a lower half with respect to the Zn atom.

The Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

FIG. 10B illustrates a large group M including three medium groups.

Note that FIG. 10C illustrates an atomic arrangement in the case where the layered structure in FIG. 10B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn—O-based material, a large group can be formed using not only the medium group L but also a medium group in which the arrangement of the In atom, the Ga atom, and the Zn atom is different from that of the medium group L.

(Embodiment 6)

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured mobility of a semiconductor are $\mu_0$ and $\mu$, respectively, and a potential barrier (such as a grain boundary) exists in the semiconductor, the mobility $\mu$ can be expressed as the following Formula 1.

$$\mu = \mu_0 \exp\left(-\frac{E}{kT}\right) \quad \text{[Formula 1]}$$

E represents the height of the potential barrier, k represents the Boltzmann constant, and T represents the absolute temperature.

When the potential barrier is assumed to be attributed to a defect, the following Formula 2 can be obtained according to the Levinson model.

$$E = \frac{e^2 N^2}{8\varepsilon n} = \frac{e^3 N^2 t}{8\varepsilon C_{ox} V_g} \quad \text{[Formula 2]}$$

e represents the elementary charge, N represents the average defect density per unit area in a channel, $\in$ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region can be expressed as the following Formula 3.

$$I_d = \frac{W \mu V_g V_d C_{ox}}{L} \exp\left(-\frac{E}{kT}\right) \quad \text{[Formula 3]}$$

L represents the channel length and W represents the channel width, and L and W are each 10 µm in this case.

In addition, $V_d$ represents the drain voltage.

When dividing both sides of Formula 3 by $V_g$ and then taking logarithms of both sides, the following Formula 4 can be obtained.

$$\ln\left(\frac{I_d}{V_g}\right) = \ln\left(\frac{W \mu V_d C_{ox}}{L}\right) - \frac{E}{kT} = \ln\left(\frac{W \mu V_d C_{ox}}{L}\right) - \frac{e^3 N^2 t}{8 kT \varepsilon C_{ox} V_g} \quad \text{[Formula 4]}$$

The right side of Formula 4 is a function of $V_g$.

Formula 4 shows that the defect density N can be obtained from the slope of a line with $\ln(I_d/V_g)$ as the ordinate and $1/V_g$ as the abscissa.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 $\text{cm}^2/\text{Vs}$.

The measured mobility of an In—Sn—Zn oxide including a defect is approximately 35 $\text{cm}^2/\text{Vs}$.

However, assuming that no defect exists inside the semiconductor and at the interface between the semiconductor and an insulating film, the mobility $\mu_0$ of the oxide semiconductor is expected to be 120 $\text{cm}^2/\text{Vs}$.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film can be expressed by the following Formula 5.

$$\frac{1}{\mu_1} = \frac{1}{\mu_0} + \frac{D}{B} \exp\left(-\frac{x}{G}\right) \quad \text{[Formula 5]}$$

D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches).

When D is increased (i.e., when the gate voltage is increased), the second term of Formula 5 is increased and accordingly the mobility $\mu_1$ is decreased.

Figure 11:
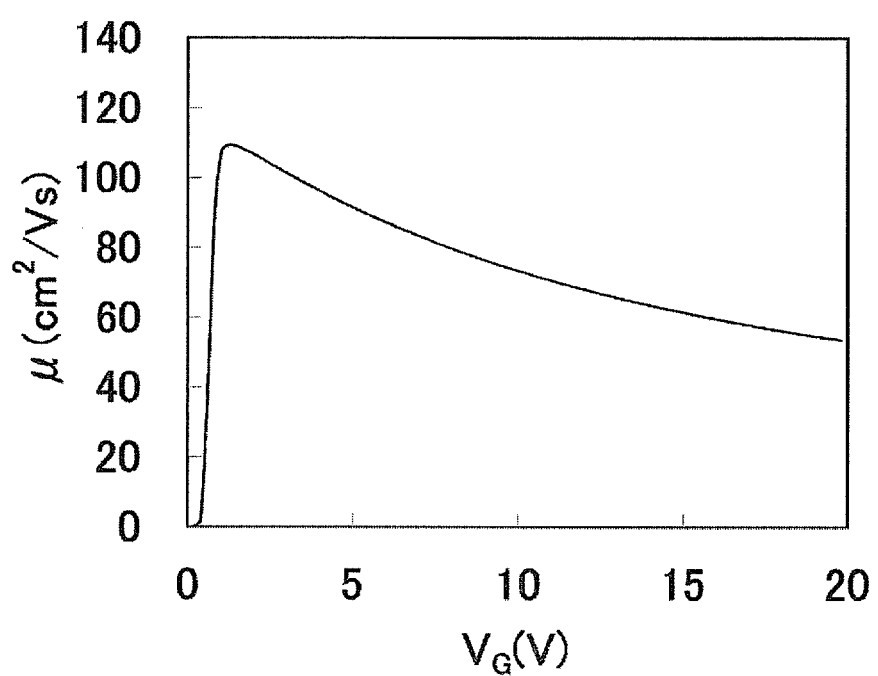
FIG. 11 shows a relation between gate voltage and field-effect mobility.

Calculation results E of the mobility $\mu_2$ of a transistor whose channel includes an ideal oxide semiconductor without a defect inside the semiconductor are shown in FIG. 11.

For the calculation, device simulation software Sentaurus Device manufactured by Synopsys, Inc. was used For the calculation, the band gap, the electron affinity, the dielectric constant, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the dielectric constant thereof was assumed to be 4.1. The channel length and the channel width were each assumed to be 10 µm, and the drain voltage $V_d$ was assumed to be 0.1 V.

As shown in the calculation results E, the mobility has a peak of greater than or equal to 100 $\text{cm}^2/\text{Vs}$ at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such mobility are calculated.

The transistor used for calculation includes a channel formation region provided between a pair of n-type semiconductor regions in the oxide semiconductor layer.

The calculation was performed under the condition that the resistivity of the pair of n-type semiconductor regions is $2 \times 10^{-3}$ Ωcm.

The calculation was performed under the condition that a channel length was 33 nm and a channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 12A:
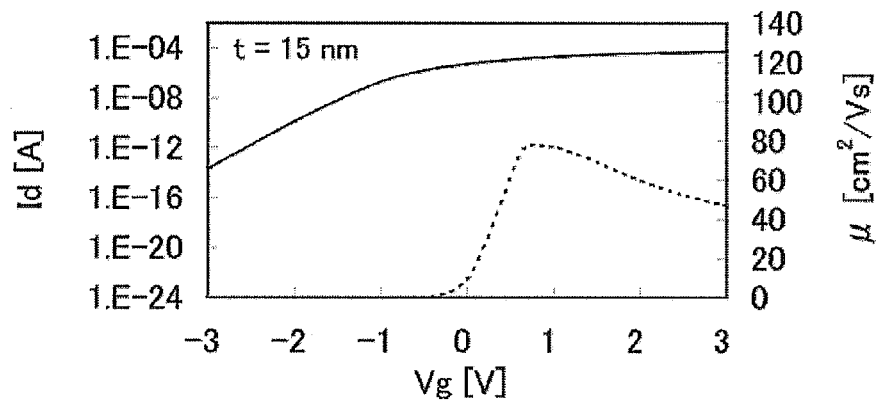
FIGS. 12A to 12C each show a relation between gate voltage and drain current.
Figure 12B:
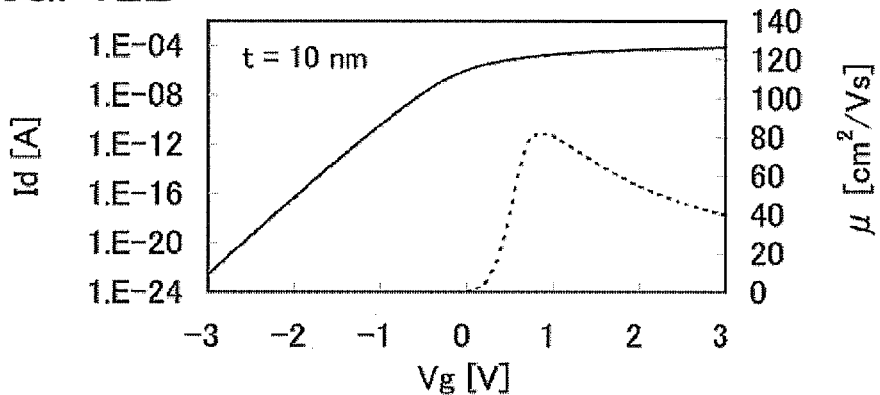
Figure 12C:
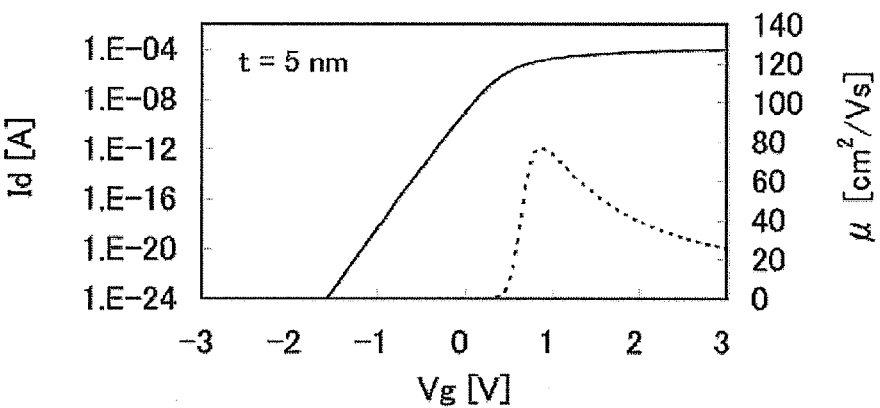

FIGS. 12A to 12C are calculation results of the gate voltage ($V_g$: a potential difference between the gate and the source) dependence of the drain current ($I_d$, solid line) and the mobility ($\mu$, dotted line) of the transistor.

The drain current $I_d$ is obtained by calculation under the condition that the drain voltage (a potential difference between the drain and the source) is +1 V and the mobility $\mu$ is obtained by calculation under the condition that the drain voltage is +0.1 V.

FIG. 12A shows the calculation result under the condition that the thickness of the gate insulating film is 15 nm.

FIG. 12B shows the calculation result under the condition that the thickness of the gate insulating film is 10 nm.

FIG. 12C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility $\mu$ and the drain current $I_d$ (on-state current) in an on state.

Figure 13A:
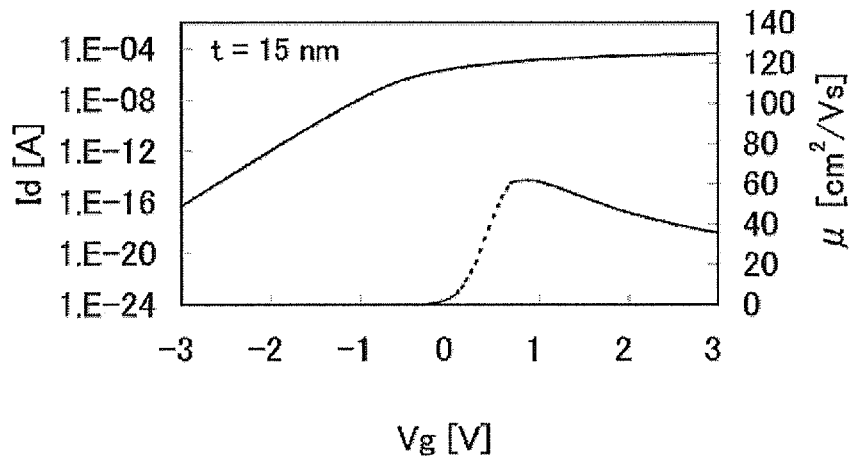
FIGS. 13A to 13C each show a relation between gate voltage and drain current.
Figure 13B:
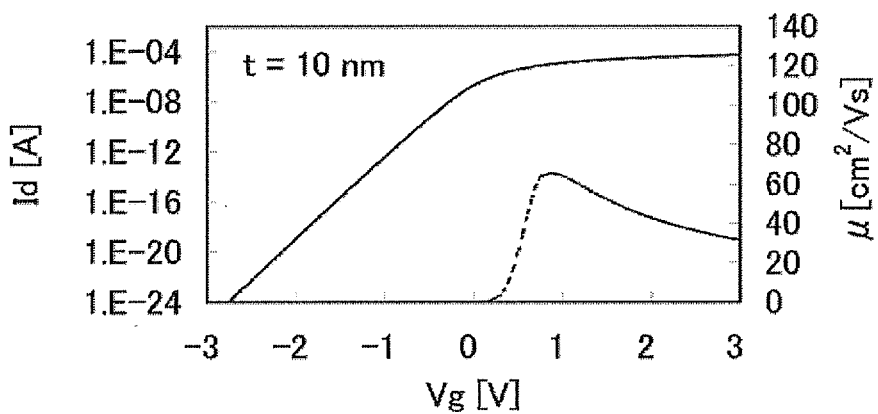
Figure 13C:
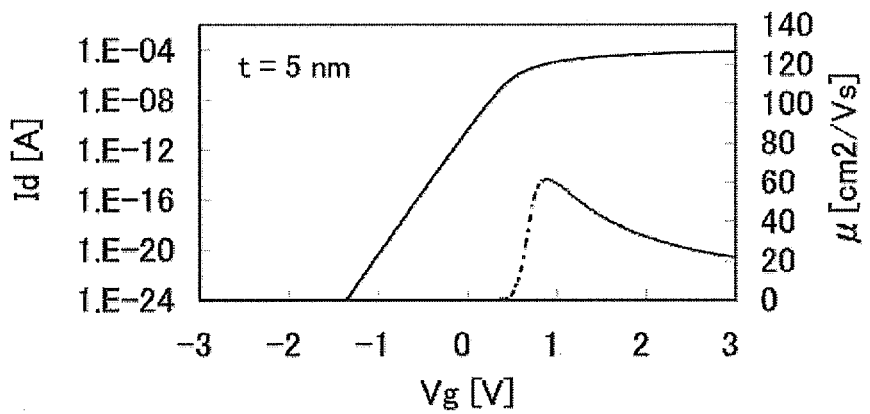

FIGS. 13A to 13C show the gate voltage $V_g$ dependence of the drain current $I_d$ (solid line) and the mobility $\mu$ (dotted line) under the condition that the offset length (sidewall length) $L_{off}$ is 5 nm.

The drain current $I_d$ is obtained by calculation under the condition that the drain voltage is +1 V and the mobility $\mu$ is obtained by calculation under the condition that the drain voltage is +0.1 V.

FIG. 13A shows the calculation result under the condition that the thickness of the gate insulating film is 15 nm.

FIG. 13B shows the calculation result under the condition that the thickness of the gate insulating film is 10 nm.

FIG. 13C shows the calculation result under the condition that the thickness of the gate insulating film is 5 nm.

Figure 14A:
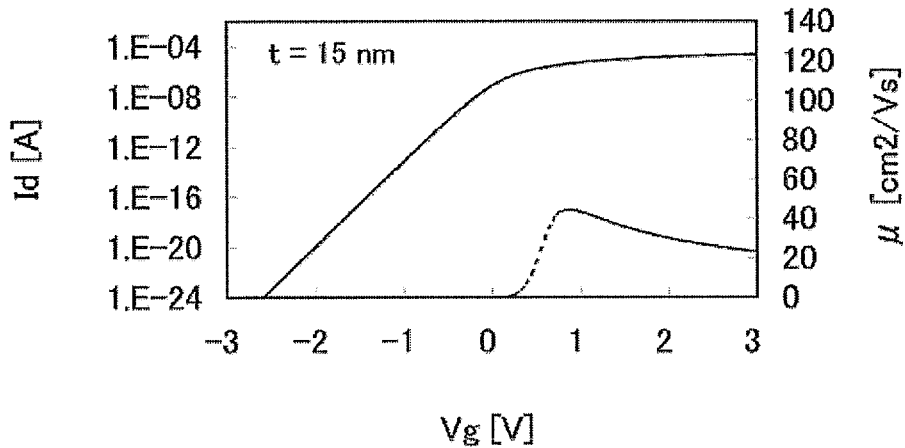
FIGS. 14A to 14C each show a relation between gate voltage and drain current.
Figure 14B:
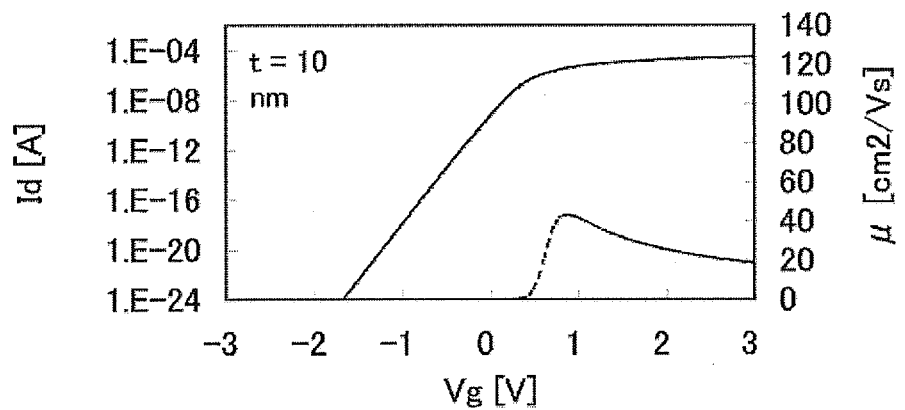
Figure 14C:
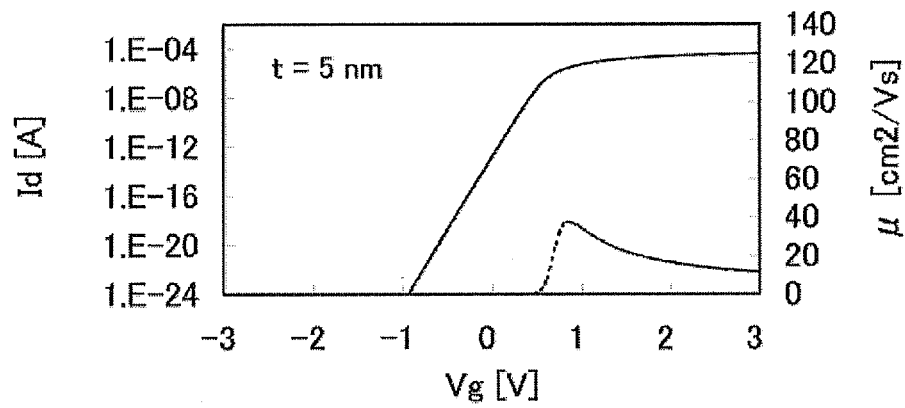

FIGS. 14A to 14C show the gate voltage dependence of the drain current $I_d$ (solid line) and the mobility $\mu$ (dotted line) under the condition that the offset length (sidewall length) $L_{off}$ is 15 nm. The drain current $I_d$ is obtained by calculation under the condition that the drain voltage is +1 V and the mobility $\mu$ is obtained by calculation under the condition that the drain voltage is +0.1 V.

FIG. 14A shows the calculation result under the condition that the thickness of the gate insulating film is 15 nm.

FIG. 14B shows the calculation result under the condition that the thickness of the gate insulating film is 10 nm.

FIG. 14C shows the calculation result under the condition that the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 12A to 12C, approximately 60 cm$^2$/Vs in FIGS. 13A to 13C, and approximately 40 cm$^2$/Vs in FIGS. 14A to 14C; thus, the peak of the mobility p is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V.

The contents of this embodiment or part thereof can be implemented in combination with any of the other embodiments and examples.

EXAMPLE 1

A transistor including an oxide semiconductor containing In, Sn, and Zn can have favorable characteristics by deposition of the oxide semiconductor while heating a substrate or by heat treatment after deposition of an oxide semiconductor film.

Note that each of In, Sn, and Zn is preferably included in a composition at 5 atomic % or more.

By intentionally heating the substrate after the deposition of the oxide semiconductor film containing In, Sn, and Zn, the field-effect mobility of the transistor can be improved.

Further, the threshold voltage of an n-channel transistor can be shifted in the positive direction.

The threshold voltage of the n-channel transistor is shifted in the positive direction, so that the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

The characteristics of a transistor including an oxide semiconductor containing In, Sn, and Zn will be described below. (Common Conditions of Sample A to Sample C)

An oxide semiconductor layer was formed over a substrate to have a thickness of 15 nm under the following conditions: a target having a composition ratio of In:Sn:Zn=1:1:1 is used; the gas flow rate is Ar/O$_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm. The tungsten layer was etched, so that a source electrode and a drain electrode were formed.

After that, a silicon oxynitride (SiON) film was formed as a gate insulating film to have a thickness of 100 nm by plasma CVD using a silane (SiH$_4$) gas and dinitrogen monoxide (N$_2$O) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm and a polyimide film with a thickness of 1.5 μm were formed as an interlayer insulating film by plasma CVD.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.
(Sample A)

In Sample A, heating was not intentionally performed to the substrate during the deposition of the oxide semiconductor layer.

Further in Sample A, heat treatment was not performed in a period after the oxide semiconductor layer was deposited before the oxide semiconductor layer was etched.
(Sample B)

In Sample B, the oxide semiconductor layer was deposited while the substrate was heated at 200° C.

Further in Sample B, heat treatment was not performed in a period after the oxide semiconductor layer was deposited before the oxide semiconductor layer was etched.

The oxide semiconductor layer was deposited while the substrate was heated in order to remove hydrogen serving as a donor in the oxide semiconductor layer.
(Sample C)

In Sample C, the oxide semiconductor layer was deposited while the substrate was heated to 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heart treatment was performed in a nitrogen atmosphere at 650° C. for one hour in order to remove hydrogen serving as a donor in the oxide semiconductor layer.

With the heat treatment for removing hydrogen serving as a donor in the oxide semiconductor layer, oxygen is also removed to form oxygen vacancy serving as a carrier in the oxide semiconductor layer.

Thus, the heat treatment in an oxygen atmosphere at 650° C. for one hour was performed for reduction in oxygen vacancy.
(Characteristics of Transistors in Sample A to Sample C)

Figure 15A:
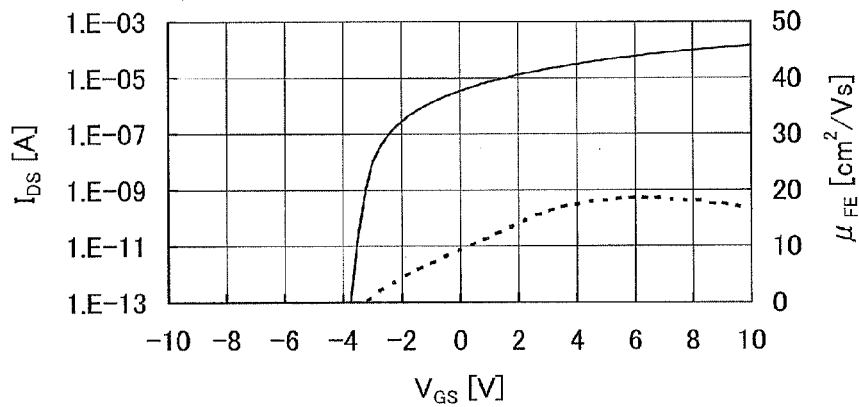
FIGS. 15A to 15C each show the characteristics of a transistor.

FIG. 15A shows initial characteristics of a transistor in Sample A.

Figure 15B:
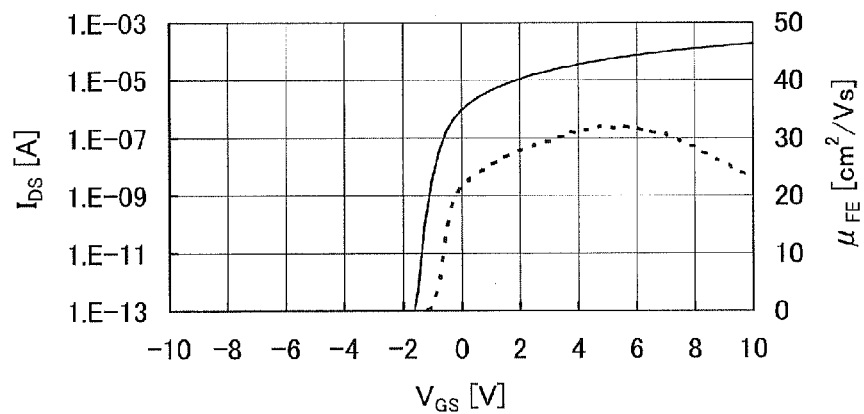

FIG. 15B shows initial characteristics of a transistor in Sample B.

Figure 15C:
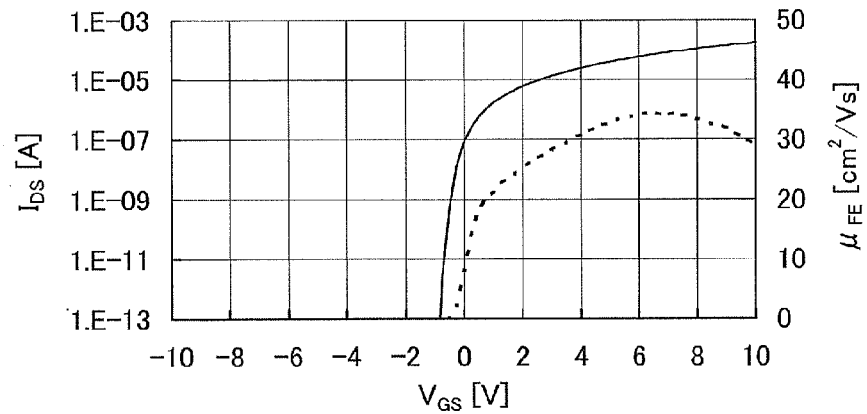

FIG. 15C shows initial characteristics of a transistor in Sample C.

The field-effect mobility of the transistor in Sample A was 18.8 cm$^2$/Vsec.

The field-effect mobility of the transistor in Sample B was 32.2 cm$^2$/Vsec.

The field-effect mobility of the transistor in Sample C was 34.5 cm$^2$/Vsec.

According to observations of cross sections of oxide semiconductor layers, which were formed by deposition methods similar to respective those of Sample A to Sample C, with a transmission electron microscope (TEM), crystallinity was observed in samples formed by the deposition methods similar to respective those of Sample B and Sample C whose substrates have been heated during deposition.

It is surprising that the sample whose substrate had been heated during deposition had a non-crystalline portion and a crystalline portion was aligned in the c-axis direction.

In a normal polycrystal, the crystalline portion is not aligned. Therefore, the sample whose substrate has been heated during deposition, has a novel crystal structure.

Comparison of FIGS. 15A to 15C leads to understanding that heat treatment performed on the substrate during or after deposition can remove an hydrogen element serving as a donor, so that the threshold voltage of the n-channel transistor can be shifted in the positive direction.

That is, the threshold voltage of Sample B in which heating was performed on the substrate during deposition is shifted in the positive direction more than the threshold voltage of Sample A in which heating was not performed on the substrate during deposition.

In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

It was therefore found that the threshold voltage can be shifted more in the positive direction by further increasing of the temperature of heat treatment.
(Results of the Gate BT Stress Test of Sample B and Sample C)

The gate BT stress test was performed on Sample B (without heat treatment after deposition) and Sample C (with heat treatment after deposition).

First, gate voltage-drain current characteristics ($V_g$–$I_d$ characteristics) of the transistors were measured at a substrate temperature of 25° C. and drain voltage ($V_d$) of 10 V to measure characteristics of the transistors before heat treatment and high positive voltage application.

Then, the substrate temperature was set to 150° C. and $V_d$ was set to 0.1 V.

After that, 20 V of gate voltage ($V_g$) was applied and the condition was kept for one hour.

Next, $V_g$ was set to 0 V.

Then, $V_g$–$I_d$ characteristics of the transistors were measured at a substrate temperature of 25° C. and $V_d$ of 10 V to measure characteristics of the transistors after heat treatment and high positive voltage application.

Comparing characteristics of transistors before and after heat treatment and high positive voltage application in the above manner is called a positive BT test.

In a similar manner, $V_g$–$I_d$ characteristics of the transistors were measured at a substrate temperature of 25° C. and $V_d$ of 10 V to measure characteristics of the transistors before heat treatment and high negative voltage application.

Then, the substrate temperature was set to 150° C. and $V_d$ was set to 0.1 V.

After that, −20 V of $V_g$ was applied and the condition was kept for one hour.

Next, $V_g$ was set to 0 V.

Then, $V_g$–$I_d$ characteristics of the transistors were measured at a substrate temperature of 25° C. and $V_d$ of 10 V to measure characteristics of the transistors after heat treatment and high negative voltage application.

Comparing characteristics of transistors before and after heat treatment and high negative voltage application in the above manner is called a negative BT test.

Figure 16A:
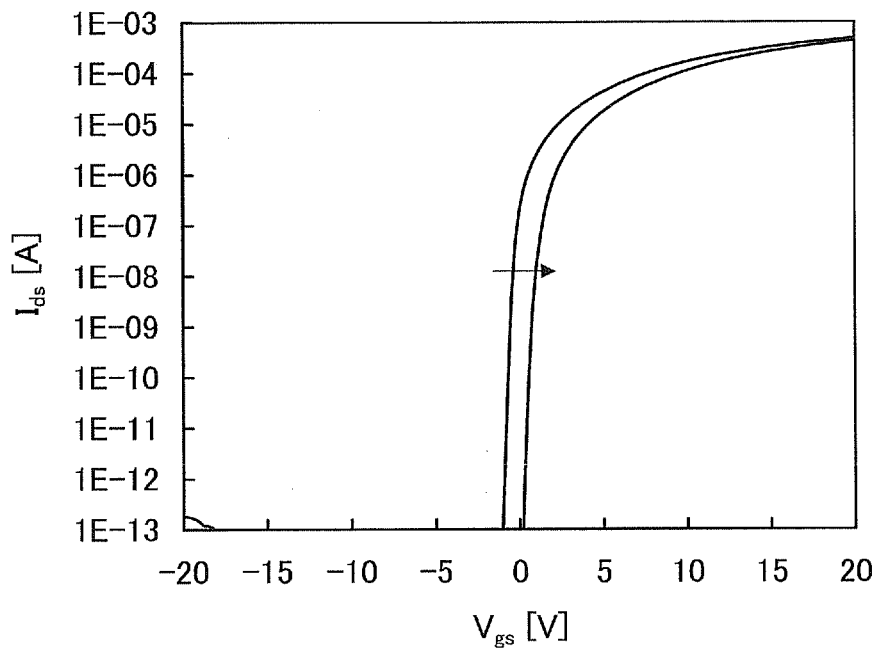
FIGS. 16A and 16B each show characteristics of transistors.
Figure 16B:
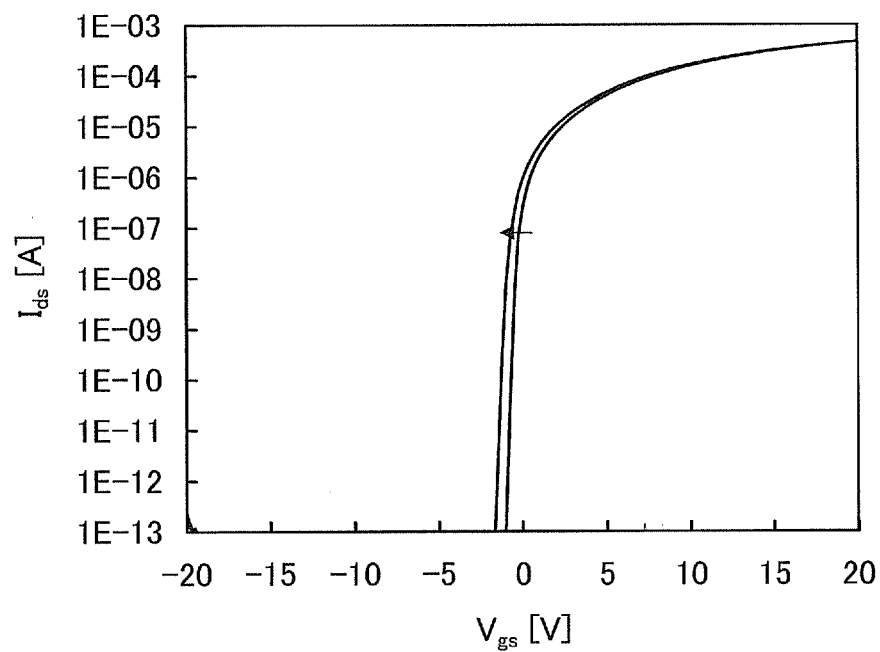

FIG. 16A shows a result of the positive BT test of Sample B and FIG. 16B shows a result of the negative BT test of Sample B.

Figure 17A:
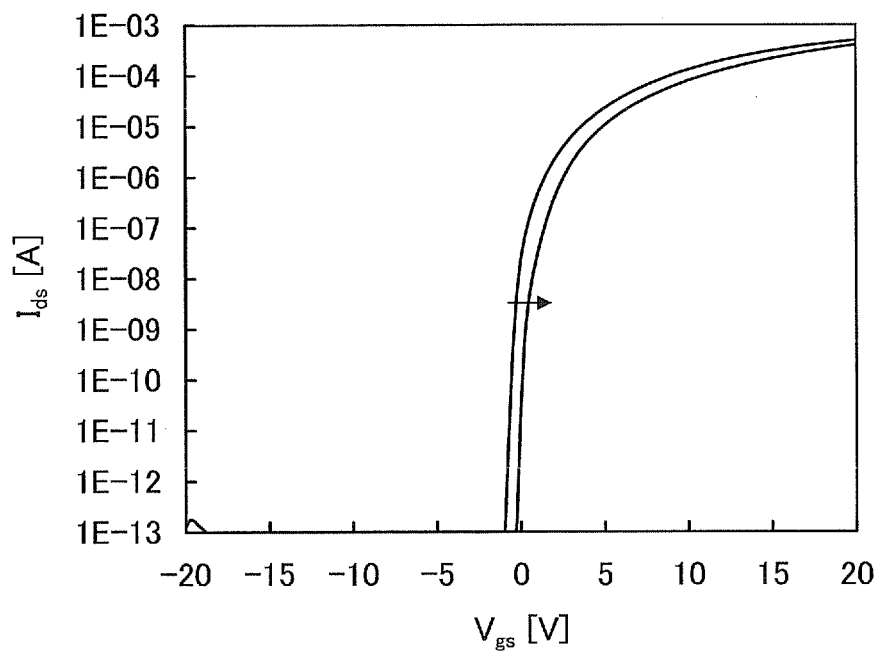
FIGS. 17A and 17B each show characteristics of transistors.
Figure 17B:
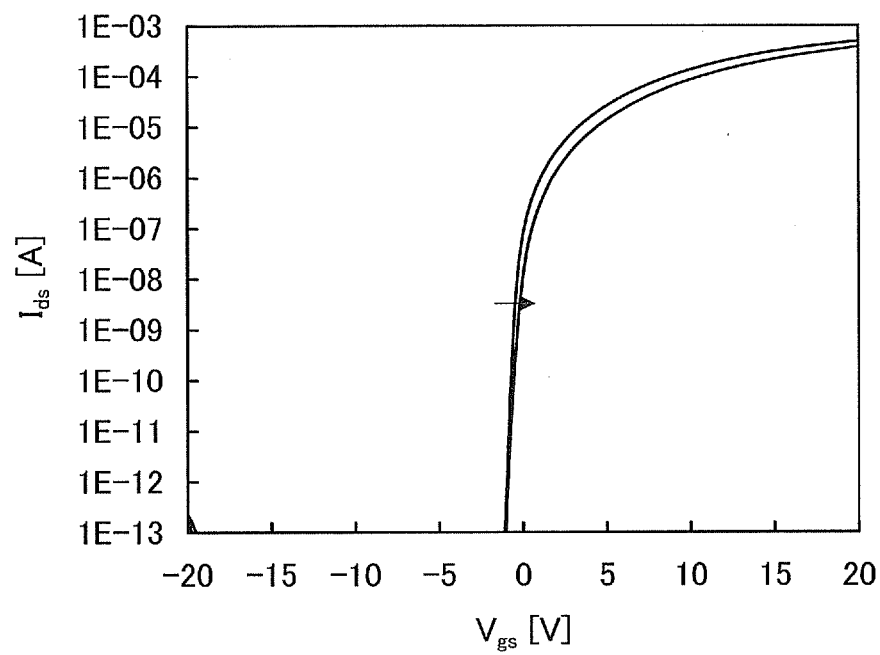

FIG. 17A shows a result of the positive BT test of Sample C and FIG. 17B shows a result of the negative BT test of Sample C.

Although the positive BT test and the negative BT test are tests used to determine the deterioration level of a transistor, with reference to FIG. 16A and FIG. 17A, it is found that the threshold voltage can be shifted in the positive direction by performing at least the positive BT test.

In particular, FIG. 16A shows that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 18:
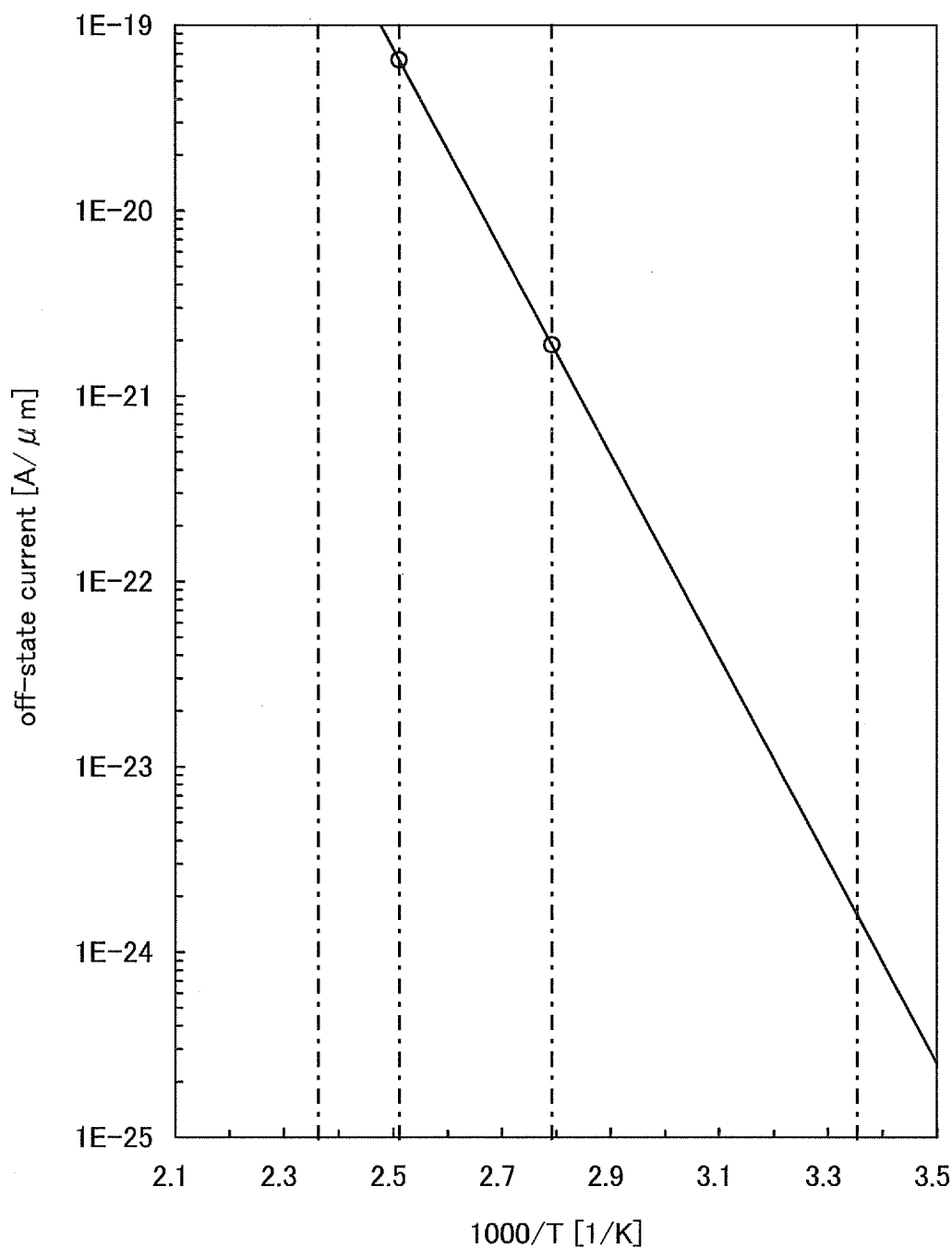
FIG. 18 shows temperature dependence of the off-state current of a transistor.

FIG. 18 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 18 illustrates the amount of current in the case where the channel width is 1 μm.

The off-state current was lower than or equal to $1\times10^{-19}$ A when the substrate temperature was 125° C. (1000/T is about 2.51).

Further, the off-state current was lower than or equal to $1\times10^{-20}$ A when the substrate temperature was 85° C. (1000/T is about 2.79).

That is, it is found that the off-state current is extremely low compared to a transistor including a silicon semiconductor.

Note that as the temperature is lower, the off-state current is decreased; thus, it is clear that the off-state current at room temperature is further lower.

This application is based on Japanese Patent Application serial no. 2011-078937 filed with the Japan Patent Office on Mar. 31, 2011 and Japanese Patent Application serial no. 2011-108885 filed with the Japan Patent Office on May 14, 2011, the entire contents of which are hereby incorporated by reference.

What is claimed is:

1. A memory device comprising:
a first wiring;
a first insulating layer over the first wiring, wherein the first insulating layer comprises a groove portion;
a semiconductor layer over the first insulating layer and in the groove portion, wherein the semiconductor layer is electrically connected to the first wiring;
a second insulating layer adjacent to the semiconductor layer in the groove;
a second wiring in the groove portion, wherein the second wiring is adjacent to the semiconductor layer with the second insulating layer interposed therebetween; and
a capacitor over the first insulating layer and the semiconductor layer, wherein the capacitor is electrically connected to the semiconductor layer,
wherein a top surface of the second wiring is positioned over a top surface of the first insulating layer.

2. The memory device according to claim 1, wherein the semiconductor layer comprises an oxide semiconductor.

3. The memory device according to claim 2, wherein the oxide semiconductor comprises indium, gallium, and zinc.

4. The memory device according to claim 1, wherein the semiconductor layer is provided on a side surface of the first insulating layer.

5. The memory device according to claim 1, further comprising a first conductive layer over the first insulating layer, wherein the semiconductor layer is provided over the first conductive layer.

6. The memory device according to claim 1, wherein the first wiring and the second wiring are orthogonal to each other.

7. The memory device according to claim 1,
wherein the first wiring is a bit line, and
wherein the second wiring is a word line.

8. The memory device according to claim 1, wherein a depth of the groove portion is 2 to 20 times as much as a width of the groove portion.

9. The memory device according to claim 1, further comprising a driver circuit below the first wiring.

10. A memory device comprising:
a first wiring;
a third insulating layer over the first wiring, wherein the third insulating layer comprises an opening;
a first conductive layer in the opening of the third insulating layer;
a first insulating layer over the third insulating layer, wherein the first insulating layer comprises a groove portion over the first conductive layer;
a semiconductor layer over the first insulating layer and the first conductive layer and in the groove portion, wherein the semiconductor layer is electrically connected to the first wiring through the first conductive layer;
a second insulating layer adjacent to the semiconductor layer;
a second wiring in the groove portion, wherein the second wiring is adjacent to the semiconductor layer with the second insulating layer interposed therebetween and provided over the first conductive layer with the semiconductor layer and the second insulating layer interposed therebetween;
a fourth insulating layer over the second wiring, wherein the fourth insulating layer comprises an opening over the first insulating layer;
a second conductive layer in the opening of the fourth insulating layer and over the semiconductor layer; and
a capacitor over the second conductive layer, wherein the capacitor is electrically connected to the semiconductor layer through the second conductive layer,
wherein a top surface of the second wiring is positioned over a top surface of the first insulating layer.

11. The memory device according to claim 10, wherein the semiconductor layer comprises an oxide semiconductor.

12. The memory device according to claim 11, wherein the oxide semiconductor comprises indium, gallium, and zinc.

13. The memory device according to claim 10, wherein the semiconductor layer is provided on a side surface of the first insulating layer.

14. The memory device according to claim 10, further comprising a third conductive layer over the first insulating layer, wherein the semiconductor layer is provided over the third conductive layer.

15. The memory device according to claim 10, wherein the first wiring and the second wiring are orthogonal to each other.

16. The memory device according to claim 10,
wherein the first wiring is a bit line, and
wherein the second wiring is a word line.

17. The memory device according to claim 10, wherein a depth of the groove portion is 2 to 20 times as much as a width of the groove portion.

18. The memory device according to claim 10, further comprising a driver circuit below the first wiring.

19. The memory device according to claim 10, wherein the first conductive layer and the second conductive layer are not overlapped with each other.

20. A memory device comprising:
a first wiring;
a third insulating layer over the first wiring, wherein the third insulating layer comprises an opening;
a first conductive layer in the opening of the third insulating layer;
a first insulating layer over the third insulating layer, wherein the first insulating layer comprises a groove portion over the first conductive layer;

a semiconductor layer over the first insulating layer and the first conductive layer and in the groove portion, wherein the semiconductor layer is electrically connected to the first wiring through the first conductive layer;

a second insulating layer adjacent to the semiconductor layer;

a second wiring in the groove portion, wherein the second wiring is adjacent to the semiconductor layer with the second insulating layer interposed therebetween and provided over the first conductive layer with the semiconductor layer and the second insulating layer interposed therebetween;

a fourth insulating layer over the second wiring, wherein the fourth insulating layer comprises an opening over the first insulating layer;

a second conductive layer in the opening of the fourth insulating layer and over the semiconductor layer;

a fifth insulating layer over the fourth insulating layer, wherein the fifth insulating layer comprises an opening over the second conductive layer; and a capacitor in the opening of the fifth insulating layer, wherein the capacitor comprises:
   a first electrode layer electrically connected to the semiconductor layer through the second conductive layer;
   a dielectric layer; and
   a second electrode layer surrounded by the first electrode layer with the dielectric layer interposed therebetween, wherein a top surface of the second wiring is positioned over a top surface of the first insulating layer.

21. The memory device according to claim 20, wherein the semiconductor layer comprises an oxide semiconductor.

22. The memory device according to claim 21, wherein the oxide semiconductor comprises indium, gallium, and zinc.

23. The memory device according to claim 20, wherein the semiconductor layer is provided on a side surface of the first insulating layer.

24. The memory device according to claim 20, further comprising a third conductive layer over the first insulating layer, wherein the semiconductor layer is provided over the third conductive layer.

25. The memory device according to claim 20, wherein the first wiring and the second wiring are orthogonal to each other.

26. The memory device according to claim 20,
wherein the first wiring is a bit line, and
wherein the second wiring is a word line.

27. The memory device according to claim 20, wherein a depth of the groove portion is 2 to 20 times as much as a width of the groove portion.

28. The memory device according to claim 20, further comprising a driver circuit below the first wiring.

29. The memory device according to claim 20, wherein the first conductive layer and the second conductive layer are not overlapped with each other.

* * * * *

UNITED STATES PATENT AND TRADEMARK OFFICE
CERTIFICATE OF CORRECTION

PATENT NO. : 8,686,486 B2  Page 1 of 1
APPLICATION NO. : 13/425674
DATED : April 1, 2014
INVENTOR(S) : Kato et al.

It is certified that error appears in the above-identified patent and that said Letters Patent is hereby corrected as shown below:

In the Specification

Column 16, line 5, "$\mu_0$, of" should be --$\mu_0$ of--;

Column 17, line 61, "mobility p" should be --mobility $\mu$--.

Signed and Sealed this
Twenty-ninth Day of July, 2014

Michelle K. Lee
*Deputy Director of the United States Patent and Trademark Office*